US009013456B2

(12) United States Patent
Chung

(10) Patent No.: US 9,013,456 B2
(45) Date of Patent: Apr. 21, 2015

(54) SCAN DRIVER AND DRIVING METHOD THEREOF

(75) Inventor: Bo-Yong Chung, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 640 days.

(21) Appl. No.: 13/006,788

(22) Filed: Jan. 14, 2011

(65) Prior Publication Data

US 2012/0075259 A1 Mar. 29, 2012

(30) Foreign Application Priority Data

Sep. 28, 2010 (KR) .................. 10-2010-0093838

(51) Int. Cl.
*G09G 5/00* (2006.01)
*G09G 3/32* (2006.01)
*G09G 3/36* (2006.01)
*G11C 19/18* (2006.01)

(52) U.S. Cl.
CPC ............ *G09G 3/3266* (2013.01); *G09G 3/3677* (2013.01); *G11C 19/184* (2013.01); *G09G 2300/0408* (2013.01); *G09G 2300/08* (2013.01); *G09G 2310/0205* (2013.01)

(58) Field of Classification Search
CPC ............ G09G 5/00; G09G 3/14; G09G 3/30; G06F 3/038; G11C 19/00
USPC .................... 345/76, 212, 204, 691; 377/64
See application file for complete search history.

(56) References Cited

U.S. PATENT DOCUMENTS

| 2005/0008114 A1* | 1/2005 | Moon ........................... 377/64 |
| 2006/0271757 A1* | 11/2006 | Kim ............................ 711/167 |
| 2007/0024539 A1* | 2/2007 | Chung ........................... 345/76 |
| 2008/0165095 A1* | 7/2008 | Jeon et al. ..................... 345/76 |

FOREIGN PATENT DOCUMENTS

| KR | 10-0646992 | 11/2006 |
| KR | 10-0666637 | 1/2007 |
| KR | 10-2007-0022550 | 2/2007 |
| KR | 10-2008-0030212 | 4/2008 |

* cited by examiner

*Primary Examiner* — Quan-Zhen Wang
*Assistant Examiner* — Yuk Chow
(74) *Attorney, Agent, or Firm* — Robert E. Bushnell, Esq.

(57) ABSTRACT

A scan driver includes a plurality of scan driving blocks including a sequential input terminal, a first clock signal input terminal, a second clock signal input terminal, and a signal output terminal. The scan driving blocks include: a first block receiving a frame start signal or an output signal of an adjacent scan driving block through the sequential input terminal, receiving a first clock signal through the first clock signal input terminal, receiving a second clock signal through the second clock signal input terminal so as to output a first output signal to the signal output terminal; and a second block receiving the first output signal through the sequential input terminal, receiving the second clock signal through the first clock signal input terminal, and receiving the first clock signal through the second clock signal input terminal so as to output a second output signal to the signal output terminal.

32 Claims, 19 Drawing Sheets

SCAN DRIVER AND DRIVING METHOD THEREOF

CLAIM OF PRIORITY

This application makes reference to, incorporates the same herein, and claims all benefits accruing under 35 U.S.C. §119 from an application earlier filed in the Korean Intellectual Property Office on Sep. 28, 2010 and there duly assigned Serial No. 10-2010-0093838.

BACKGROUND OF THE INVENTION

1. Field of the Invention

The present invention relates to a scan driver and a driving method thereof. More particularly, the present invention relates to a scan driver which is capable of being driven with a small number of clock signals, and a driving method thereof.

2. Description of the Related Art

Currently, various flat panel displays which can reduce the weight and the volume which are drawbacks of the cathode ray tube have been developed. As flat panel displays, there are a liquid crystal display (LCD), a field emission display, a plasma display panel (PDP) and an organic light emitting diode OLED.

The flat panel display includes a display panel consisting of a plurality of pixels arranged in a matrix format. The display panel includes a plurality of scan lines in a row direction and a plurality of data lines in a column direction, and the plurality of scan lines and the plurality of data lines intersect. The plurality of pixels are driven by scan signals and data signals transmitted through the corresponding scan lines and data lines.

The flat panel display is classified into a passive matrix light emitting display device and an active matrix light emitting display device according to the driving method thereof. Among them, the active matrix type, which selectively turns on/off the pixels, is mainly used in terms of resolution, contrast, and operation speed.

The active matrix organic light emitting diode (OLED) display writes a data signal in synchronization with the time that a scan signal is transmitted to a pixel. The scan signal may be transmitted to the scan line in a forward direction or a backward direction according to the arrangement of the scan line. As described above, the scan driver functions as a shift register for sequentially driving scan signals.

Recently, as the size of display panels has increased and the organic light emitting diode (OLED) display for displaying a 3D image has been developed, high speed of the scan driver has been required. To drive a panel of the active matrix type organic light emitting diode (OLED) display of a large size, the scan driver must drive a large load and duty control must be possible in order to minimize a motion blur. Also, to display a 3D image, it is preferable that the scan driver be driven with simultaneous light emission and a high speed of more than 240 Hz.

The above information disclosed in this Background section is only for enhancement of an understanding of the background of the invention, and therefore it may contain information which does not form the prior art which is already known in this country to a person of ordinary skill in the art.

SUMMARY OF THE INVENTION

The present invention provides a scan driver which is capable of being driven with duty adjustment, simultaneous light emission, and a high speed in a display device for displaying a 3D image of a large size, and a driving method thereof.

A scan driver according to an exemplary embodiment of the present invention comprises a plurality of scan driving blocks including a sequential input terminal, a first clock signal input terminal, a second clock signal input terminal, an inverse-output input terminal, and a signal output terminal; wherein the plurality of scan driving blocks respectively include: a first block for receiving a frame start signal or an output signal of an adjacent scan driving block through the sequential input terminal, for receiving a first clock signal through the first clock signal input terminal, and for receiving a second clock signal having an inverse-phase voltage level of the first clock signal through the second clock signal input terminal so as to output a first output signal to the signal output terminal; and a second block for receiving the first output signal through the sequential input terminal, for receiving the second clock signal through the first clock signal input terminal, and for receiving the first clock signal through the second clock signal input terminal so as to output a second output signal to the signal output terminal.

The second output signal may be transmitted to the inverse-output input terminal of the first block.

The plurality of scan driving blocks may respectively include: a first transistor for transmitting the signal applied to the second clock signal input terminal to the signal output terminal; a second transistor for transmitting a power source voltage of a logic high level to the signal output terminal; a third transistor for transmitting a power source voltage of a logic low level for turning on the second transistor; a fourth transistor for transmitting the power source voltage of the logic high level for turning off the second transistor; and a fifth transistor for transmitting the signal applied to the sequential input terminal to the gate electrode of the first transistor.

The first transistor may include a gate electrode to which the signal applied to the sequential input terminal is applied, one terminal connected to the second clock signal input terminal, and another terminal connected to the signal output terminal.

The second transistor may include a gate electrode to which a power source voltage of the logic high level or a power source voltage of the logic low level is applied, one terminal connected to the power source of the logic high level, and another terminal connected to the signal output terminal.

The third transistor may include a gate electrode connected to the inverse-output input terminal, one terminal connected to the power source of the logic low level, and another terminal connected to the gate electrode of the second transistor.

The fourth transistor may include a gate electrode connected to the sequential input terminal, one terminal connected to the power source of the logic high level, and another terminal connected to the gate electrode of the second transistor.

The fifth transistor may include a gate electrode connected to the first clock signal input terminal, one terminal connected to the sequential input terminal, and another terminal connected to the gate electrode of the first transistor.

The plurality of scan driving blocks may respectively further include a first capacitor having one terminal connected to a VGH power source and another terminal connected to the gate electrode of the second transistor.

The plurality of scan driving blocks may respectively include a second capacitor having one terminal connected to the gate electrode of the first transistor and another terminal connected to the other terminal of the first transistor.

A scan driver according to another exemplary embodiment of the present invention includes a sequential input terminal, a first clock signal input terminal, a second clock signal input terminal, an inverse-output input terminal, and a signal output terminal; wherein the plurality of scan driving blocks respectively include: a first input block for receiving a first frame start signal or a first sequential output signal of an adjacent scan driving block through the sequential input terminal, for receiving a first clock signal through the first clock signal input terminal, and for receiving a second clock signal having an inverse-phase voltage level of the first clock signal through the second clock signal input terminal so as to output the first sequential output signal to the first sequential output terminal; a second input block for receiving a second frame start signal or a second sequential output signal of an adjacent scan driving block through the sequential input terminal, for receiving one of the first clock signal and the second clock signal through the first clock signal input terminal, and for receiving the other of the first clock signal and the second clock signal through the second clock signal input terminal differently from the first clock signal input terminal so as to output the second sequential output signal to the second sequential output terminal; and an output block for receiving the first sequential output signal and the second sequential output signal so as to output the output signal of a predetermined pulse width to the signal output terminal.

The first input block may include a first inverse-output input terminal to which the first sequential output signal of the first sequential output terminal of the adjacent scan driving block is applied.

The second input block may include a second inverse-output input terminal to which the second sequential output signal of the second sequential output terminal of the adjacent scan driving block is applied.

The output block may output a voltage of a logic high level during a predetermined pulse width. The output block may output a voltage of a logic low level during the predetermined pulse width.

The output block may include: a first transistor including a gate electrode connected to the first sequential output terminal of the first input block so as to output the power source voltage of the logic high level; a second transistor including a gate electrode connected to the first sequential output terminal of the first input block so as to output the power source voltage of the logic low level; a third transistor including a gate electrode connected to the second sequential output terminal of the second input block so as to output the power source voltage of the logic low level; a fourth transistor including a gate electrode connected to the power source of the logic low level through the third transistor, and connected to the power source of the logic high level through the first transistor; a fifth transistor including a gate electrode connected to the power source of the logic low level through the second transistor, and connected to the power source of the logic high level through the fourth transistor, so as to transmit the power source voltage of the logic high level to the signal output terminal; and a sixth transistor including a gate electrode connected to the power source of the logic high level through the first transistor, and connected to the power source of the logic low level through the third transistor so as to transmit the power source voltage of the logic low level to the signal output terminal.

The first transistor may include a gate electrode connected to the first sequential output terminal of the first input block, one terminal connected to the power source of the logic high level, and another terminal connected to the gate electrode of the fourth transistor and the gate electrode of the sixth transistor.

The second transistor may include a gate electrode connected to the first sequential output terminal of the first input block, one terminal connected to the power source of the logic low level, and another terminal connected to the gate electrode of the fifth transistor.

The third transistor may include a gate electrode connected to the second sequential output terminal of the second input block, one terminal connected to the power source of the logic low level, and another terminal connected to the gate electrode of the fourth transistor and the gate electrode of the sixth transistor.

The fourth transistor may include a gate electrode connected to the other terminal of the first transistor and the other terminal of the third transistor, one terminal connected to the power source of the logic high level, and another terminal connected to the gate electrode of the fifth transistor.

The fifth transistor may include a gate electrode connected to the other terminal of the second transistor and the other terminal of the fourth transistor, one terminal connected to the power source of the logic high level, and another terminal connected to the signal output terminal.

The sixth transistor may include a gate electrode connected to the other terminal of the first transistor and the other terminal of the third transistor, one terminal connected to the power source of the logic low level, and another terminal connected to the signal output terminal.

The output block may further include a first capacitor including one terminal connected to the power source of the logic high level and another terminal connected to the gate electrode of the fifth transistor.

The output block may further include a second capacitor including one terminal connected to the gate electrode of the sixth transistor and another terminal connected to the other terminal of the sixth transistor.

The output block may include: a seventh transistor, including a gate electrode connected to a typical signal input terminal so as to output the output signal of the logic low level from the signal output terminal, one terminal connected to the power source of the logic high level, and another terminal connected to the gate electrode of the fifth transistor; and an eighth transistor, including a gate electrode connected to the typical signal input terminal, one terminal connected to the power source of the logic low level, and another terminal connected to the gate electrode of the sixth transistor.

The output block may further include: a seventh transistor including a gate electrode connected to the typical signal input terminal so as to output the output signal of the logic high level from the output terminal, one terminal connected to the power source of the logic high level, and another terminal connected to the gate electrode of the sixth transistor; and an eighth transistor including a gate electrode connected to the typical signal input terminal, one terminal connected to the power source of the logic low level, and another terminal connected to the gate electrode of the fifth transistor.

A typical signal of the gate-on voltage turning on the seventh transistor and the eighth transistor may be simultaneously transmitted to the plurality of scan driving blocks.

The output block may further include: a seventh transistor including a gate electrode connected to the first typical signal input terminal so as to output the output signal of the logic high level from the signal output terminal, one terminal connected to the power source of the logic high level, and another terminal connected to the gate electrode of the sixth transistor; and an eighth transistor including a gate electrode connected to the first typical signal input terminal, one terminal connected to the power source of the logic low level, and another terminal connected to the gate electrode of the fifth transistor; a ninth transistor including a gate electrode connected to the second typical signal input terminal so as to output the output signal of the logic low level from the signal output terminal, one terminal connected to the power source of the logic high level, and another terminal connected to the gate electrode of the fifth transistor; and a tenth transistor including a gate electrode connected to the second typical signal input terminal, one terminal connected to the power source of the logic low level, and another terminal connected to the gate electrode of the sixth transistor.

A first typical signal of the gate-on voltage turning on the seventh transistor and the eighth transistor may be simultaneously transmitted to the plurality of scan driving blocks.

The second typical signal of the gate-on voltage turning on the ninth transistor and the tenth transistor may be simultaneously transmitted to the plurality of scan driving blocks.

A driving method of a scan driver which includes a plurality of scan driving blocks, according to another exemplary embodiment of the present invention, comprises: applying a frame start signal or an output signal of an adjacent scan driving block to a sequential input terminal of a first block; applying a first clock signal to a first clock signal input terminal of the first block and a second clock signal having an inverse-phase voltage level of the first clock signal to a second clock signal input terminal so as to output a first output signal; applying the first output signal to a sequential input terminal of a second block; and applying the second clock signal to the first clock signal input terminal of the second block and the first clock signal to the second clock signal input terminal so as to output the second output signal.

The method may further include transmitting the first output signal and the second output signal to a third block outputting a third output signal of a predetermined pulse width.

The method may further include simultaneously transmitting a typical signal so as to output an output signal of a logic low level to a plurality of third blocks included in the plurality of scan driving blocks.

The method may further include simultaneously transmitting a typical signal so as to output an output signal of a logic low level to a plurality of third blocks included in the plurality of scan driving blocks.

The method may further include simultaneously transmitting a typical signal so as to output an output signal of a logic high level to a plurality of third blocks included in the plurality of scan driving blocks.

The scan driver according to the present invention is capable of being driven with high speed by using a small number of clock signals, and duty adjustment of the clock signal and overlap drive are possible.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
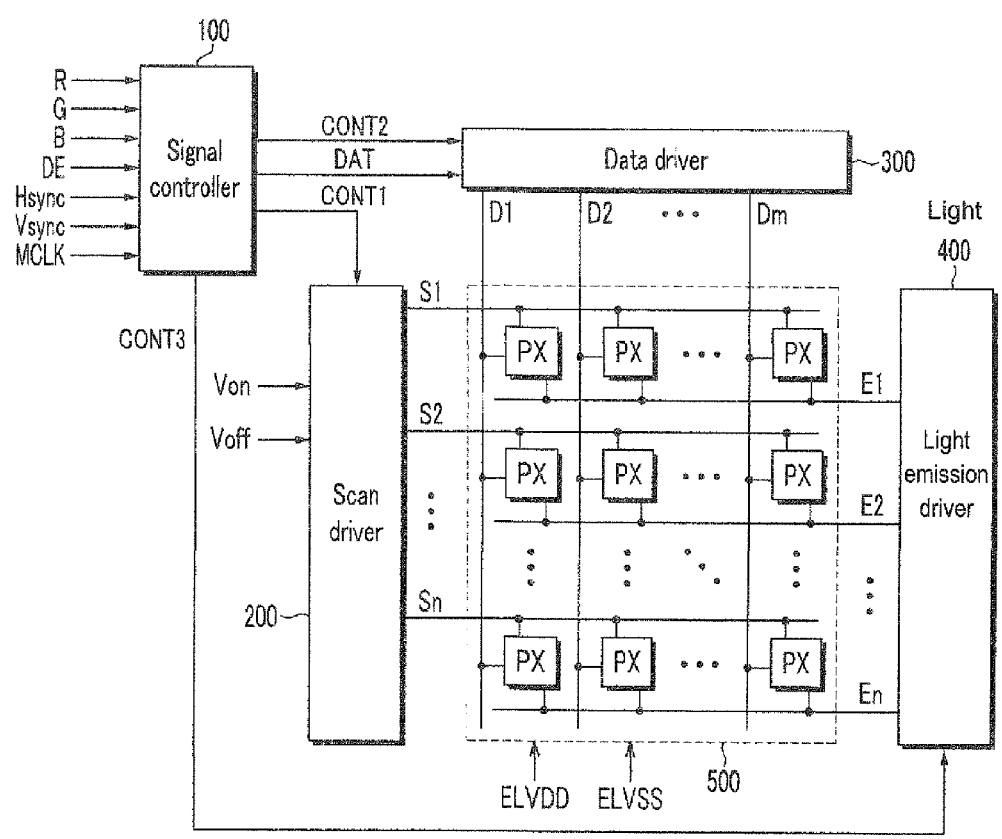
FIG. 1 is a block diagram of an organic light emitting diode (OLED) display according to an exemplary embodiment of the present invention.

In the following detailed description, only certain exemplary embodiments of the present invention are shown and described simply by way of illustration. As those skilled in the art will realize, the described embodiments may be modified in various different ways, all without departing from the spirit or scope of the present invention.

Constituent elements having the same structures throughout the embodiments are denoted by the same reference numerals and are described in a first exemplary embodiment. In the other exemplary embodiments, only constituent elements other than the same constituent elements are described.

To clearly describe the exemplary embodiments of the present invention, parts not related to the description are omitted, and like reference numerals designate like constituent elements throughout the specification.

Throughout this specification and the claims that follow, when it is described that an element is "coupled" to another element, the element may be "directly coupled" to the other element or "electrically coupled" to the other element through a third element. In addition, unless explicitly described to the contrary, the word "comprise" and variations such as "comprises" or "comprising" will be understood to imply the inclusion of stated elements but not the exclusion of any other elements.

FIG. 1 is a block diagram of an organic light emitting diode (OLED) display according to an exemplary embodiment of the present invention.

Referring to FIG. 1, the organic light emitting diode (OLED) display includes a signal controller 100, a scan driver 200, a data driver 300, a light emission driver 400, and a display unit 500.

The signal controller 100 receives video signals R, G, B which are inputted from an external device, and an input control signal which controls displaying thereof. The video signal R, G, B includes luminance of each pixel PX, and the luminance has a grayscale having a predetermined number, for example, $1024=2^{10}$, $256=2^8$, or $64=2^6$. As examples of the input control signal, there are a vertical synchronization signal Vsync, a horizontal synchronization signal Hsync, a main clock MCLK, and a data enable signal DE.

The signal controller 100 appropriately processes the input video signals R, G, B according to the operation condition of the display unit 500 and the data driver 300 on the basis of the input video signals R, G, B and the input control signal, and generates a scan control signal CONT1, a data control signal CONT2, an image data signal DAT, and a light emission control signal CONT3. The signal controller 100 transmits the scan control signal CONT1 to the scan driver 200. The signal controller 100 transmits the data control signal CONT2 and image data signal DAT to the data driver 300. The signal controller 100 transmits the light emission control signal CONT3 to the light emission driver 400.

The display unit 500 includes a plurality of scan lines S1-Sn, a plurality of data lines D1-Dm, a plurality of light emitting lines E1-En, and a plurality of pixels PX connected to the plurality of lines S1-Sn, D1-Dm, and E1-En arranged in an approximate matrix form. The plurality of scan lines S1-Sn are extended in a row direction and are in parallel with each other. The plurality of data lines D1-Dm are extended in a column direction and are in parallel with each other. The plurality of light emitting lines E1-En, respectively corresponding to the scan lines S1-Sn, are extended in a row direction and are in parallel with each other. The pixels PX of the display unit 500 receive the first power source voltage ELVDD and the second power source voltage ELVSS from the outside.

The scan driver 200 is connected to the plurality of scan lines S1-Sn, and applies scan signals, which include a combination of a gate-on voltage Von which turns on the switching transistor (referring to M1 of FIG. 2) and a gate-off voltage Voff which turns it off, to the plurality of scan lines S1-Sn according to the scan control signal CONT1. The scan driver 200 applies the scan signal to the plurality of scan lines S1-Sn such that the data signal is applied to the plurality of pixels PX.

The scan control signal CONT1 includes a frame start signal FLM and a plurality of clock signals CLK and CLKB. The frame start signal FLM is a signal for generating the first scan signal for displaying the image of one frame. The plurality of clock signals are synchronization signals for generating the scan signals to the plurality of scan lines S1-Sn.

The scan driver 200 sequentially transmits the scan signals to the plurality of scan lines S1-Sn according to the signals FLM, INT1, SCLK1, and SCLK2 included in the scan control signal CONT1.

The data driver 300 is connected to a plurality of data lines D1-Dm, and selects a data voltage according to the image data signal DAT. The data driver 300 applies the selected data voltage as the data signal to a plurality of data lines D1-Dm according to the data control signal CONT2.

The light emission driver 400 is connected to a plurality of light emitting lines E1-En, and applies the light emitting signal, which includes a combination of a gate-on voltage Von which turns on the switching transistor (referring to M3 of FIG. 2) and a gate-off voltage Voff which turns it off, to the plurality of light emitting lines E1-En according to the light emission control signal CONT3.

The organic light emitting diode (OLED) display according to the present invention may be driven by light emission driver 400 which includes a scan section for applying a data signal to the plurality of pixels PX included in the display unit 500, and a sustain section for emitting all pixels PX. The light emission driver 400 applies the gate-off voltage to the plurality of light emitting lines E1-En in the scan section, and the gate-on voltage to the plurality of light emitting lines E1-En in the sustain section.

Figure 2:
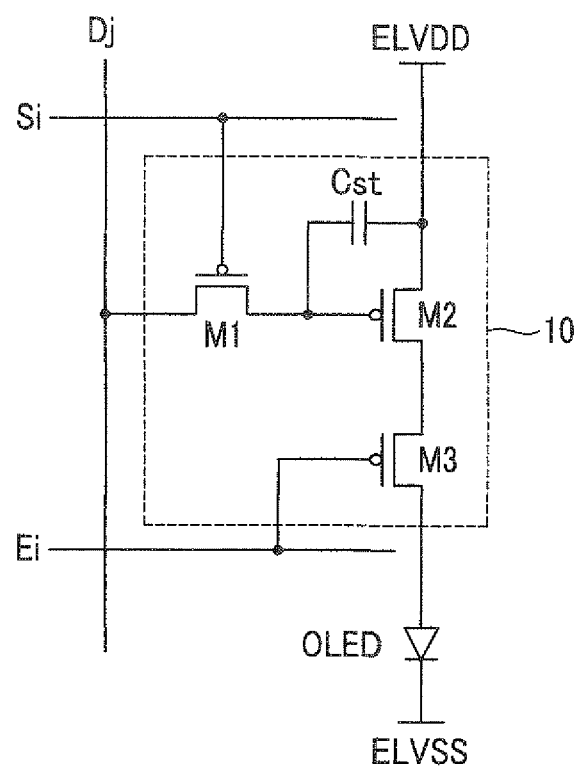
FIG. 2 is a circuit diagram of a pixel according to an exemplary embodiment of the present invention.

FIG. 2 is a circuit diagram showing a pixel according to an exemplary embodiment of the present invention.

Referring to FIG. 2, the pixel PX of the organic light emitting diode (OLED) display includes the organic light emitting diode OLED and a pixel circuit 10 for controlling the organic light emitting diode OLED. The pixel circuit 10 includes a switching transistor M1, a driving transistor M2, a light emitting transistor M3, and a storage capacitor Cst.

The switching transistor M1 includes a gate electrode connected to the scan line Si, one terminal connected to the data line Dj, and another terminal connected to the gate electrode of the driving transistor M2.

The driving transistor M2 includes a gate electrode connected to the other terminal of the switching transistor M1, one terminal connected to the ELVDD power source, and another terminal connected to one terminal of the light emitting transistor M3.

The light emitting transistor M3 includes a gate electrode connected to the light emitting line Ei, one terminal connected to the other terminal of the driving transistor M2, and another terminal connected to the anode of the organic light emitting diode (OLED).

The storage capacitor Cst includes one terminal connected to the gate electrode of the driving transistor M1 and another terminal connected to the one terminal of the driving transistor M1. The storage capacitor Cst charges the data voltage applied to the gate electrode of the driving transistor M2, and it is maintained after the switching transistor M1 is turned off.

The organic light emitting diode (OLED) includes an anode connected to the other terminal of the light emitting transistor M3 and a cathode connected to the ELVSS power source.

The switching transistor M1, the driving transistor M2, and the light emitting transistor M3 may be p-channel field effect transistors. The gate-on voltage for turning on the switching transistor M1, the driving transistor M2, and the light emitting transistor M3 is a logic low level voltage, and the gate-off voltage for turning it off is a logic high level voltage.

In this regard, the latter elements are p-channel field effect transistors, but at least one of the switching transistor M1, the driving transistor M2, and the light emitting transistor M3 may be an n-channel field effect transistor, and the gate-on voltage for turning on the n-channel electric field effect transistor is a logic high voltage, and the gate-off voltage for turning it off is a logic low voltage.

When the gate-on voltage Von is applied to the scan line Si, the switching transistor M1 is turned on, and a data signal applied to the data line Dj is applied to one terminal of the sustain capacitor Cst through the turned-on switching transistor M1 so as to charge the sustain capacitor Cst. The driving transistor M2 controls the amount of current flowing from the ELVDD power source to the organic light emitting diode OLED in correspondence with a voltage value charged in the storage capacitor Cst. When the gate-on voltage is applied to the light emitting line Ei, the light emitting transistor M3 is turned on, and the current flowing from the ELVDD power source to the driving transistor M2 flows to the organic light emitting diode (OLED). The organic light emitting diode OLED generates light in correspondence with the amount of current flowing through the driving transistor M2.

The organic light emitting diode OLED may emit light of one of the primary colors. The primary colors include, for example, three primary colors of red, green, and blue, and a desired color is displayed with a spatial or temporal sum of the three primary colors. In this case, the organic light emitting diode (OLED) may partially emit white light, and accordingly luminance is increased. Alternatively, the organic light emitting diodes (OLEDs) of all pixels PX may emit white light, and some of the pixels PX may further include a color filter (not shown) which changes white light emitted from the organic light emitting diodes (OLEDs) to light of one of the primary colors.

Each driving device 100, 200, 300, and 400 may be directly mounted on the display unit 500 in the form of at least one integrated circuit chip, mounted on a flexible printed circuit film, attached to the display unit 500 in the form of a tape carrier package (TCP), or mounted on a separate printed circuit board (PCB). Alternatively, they may be integrated into the display unit 500 together with the signal lines S1-Sn, D1-Dm, and E1-En.

The Scan Driver According to the First Exemplary Embodiment

Figure 3:
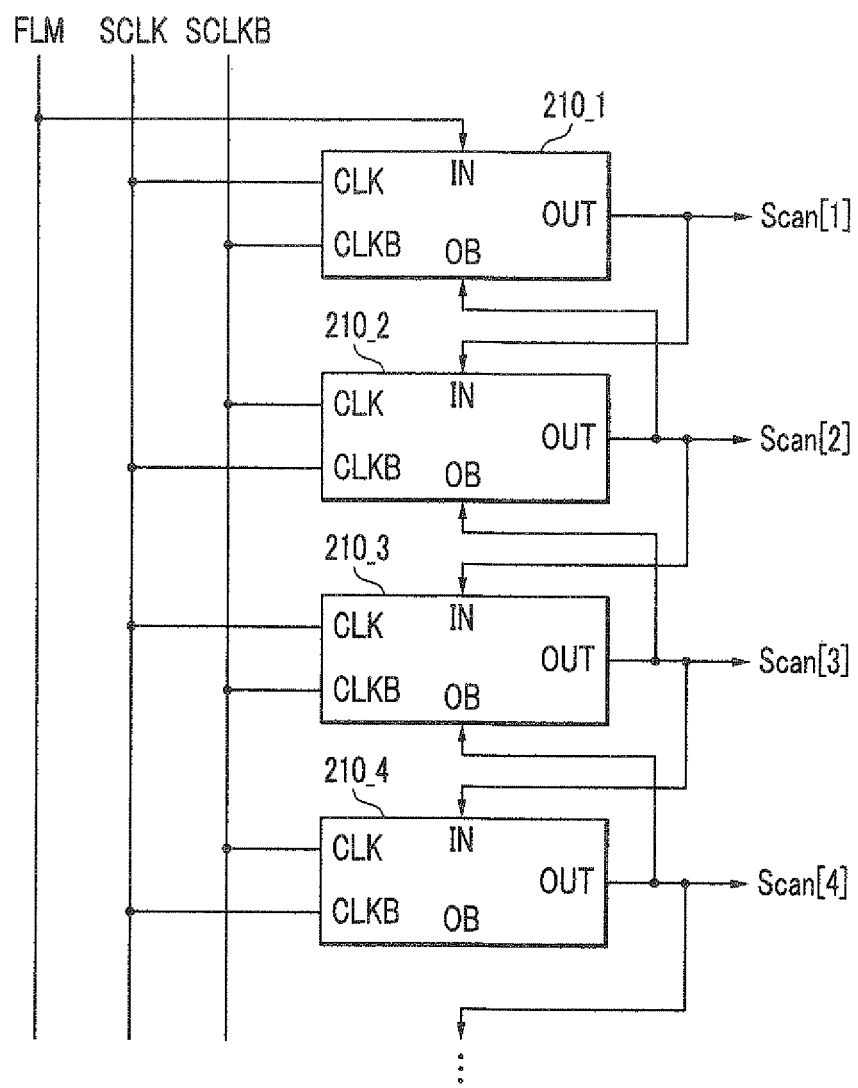
FIG. 3 is a block diagram of a configuration of a scan driver according to an exemplary embodiment of the present invention.

FIG. 3 is a block diagram showing a configuration of a scan driver according to an exemplary embodiment of the present invention. The scan driver according to the first exemplary embodiment may be used as the scan driver 200 of FIG. 1.

Referring to FIG. 3, the scan driver includes a plurality of scan driving blocks 210_1, 210_2, 210_3, 210_4, . . . for generating a plurality of scan signals. Each of the scan driving blocks 210_1, 210_2, 210_3, 210_4, . . . receives an input signal so as to generate the scan signals Scan, Scan, Scan, Scan, . . . which are transmitted to the plurality of scan lines S1-Sn.

Each of the scan driving blocks 210_1, 210_2, 210_3, 210_4, . . . includes a first clock signal input terminal CLK, a second clock signal input terminal CLKB, an inverse-output input terminal OB, a sequential input terminal IN inputted with the frame start signal FLM or the output signal of the adjacent scan driving block, and a signal output terminal OUT.

The input signal of each of the scan driving blocks 210_1, 210_2, 210_3, 210_4, . . . includes a first clock signal SCLK, a second clock signal SCLKB, and an output signal of the adjacent scan driving block.

The first clock signal input terminal CLK of the odd-numbered scan driving blocks 210_1, 210_3, . . . is connected to the wire of the first clock signal SCLK, and the second clock signal input terminal CLKB is connected to the wire of the second clock signal SCLKB. The first clock signal input terminal CLK of the even-numbered scan driving blocks 210_2, 210_4, . . . is connected to the wire of the second clock signal SCLKB, and the second clock signal input terminal CLKB of the even-numbered scan driving blocks 210_2, 210_4, . . . is connected to the wire of the first clock signal SCLK.

The sequential input terminal IN of the first scan driving block 210_1 has the frame start signal FLM applied thereto, and the sequential input terminal IN of the other scan driving blocks 210_2, 210_3, 210_4, . . . have the output signal Scan[1], Scan[2], Scan[3] of the scan driving blocks 210_1, 210_2, 210_3, respectively, applied thereto.

The inverse-output input terminal OB of each of the scan driving blocks 210_1, 210_2, 210_3, 210_4, . . . has the output signal of the following scan driving block 210_2, 210_3, 210_4, . . . applied thereto.

Each of the scan driving blocks 210_1, 210_2, 210_3, 210_4, . . . outputs the scan signals Scan[1], Scan[2], Scan[3], Scan[4], . . . generated according to the signal input to the sequential input terminal IN, the first clock signal input terminal CLK, the second clock signal input terminal CLKB, and the inverse-output input terminal OB to the signal output terminal OUT. The plurality of scan driving blocks 210_1, 210_2, 210_3, 210_4, . . . sequentially output the scan signal of the gate-on voltage. Thereafter, the output signal outputted by the scan driving block means the scan signal of the gate-on voltage turning on the switching transistor M1.

The first scan driving block 210_1 transmits the scan signal Scan of the gate-on voltage generated by receiving the frame start signal FLM to the first scan line Scan[1] and to the second scan driving block 210_2. The second scan driving block 210_2 transmits the scan signal Scan of the gate-on voltage generated by receiving the scan signal Scan[1] of the first scan driving block 210_1 to the second scan line Scan[2], to the third scan driving block 210_3, and to the first scan driving block 210_1. If the scan signal Scan of the second scan driving block 210_2 is applied to the first scan driving block 210_1, the scan signal of the first scan driving block 210_1 is converted into the scan signal of the gate-off voltage and is outputted. That is, the (k+1)-th arranged scan driving block outputs the scan signal Scan generated by receiving the scan signal Scan outputted from the k-th arranged scan driving block as the adjacent scan driving block, and the k-th arranged scan driving block receives the scan signal Scan of the (k+1)-th arranged scan driving block so as to convert it into the level of the scan signal and outputs it (1<=k<N). As described above, the scan signal is sequentially generated from the first scan driving block 210_1 to the n-th scan driving block 210_n (not shown), and is transmitted to the plurality of scan lines S1-Sn.

Figure 4:
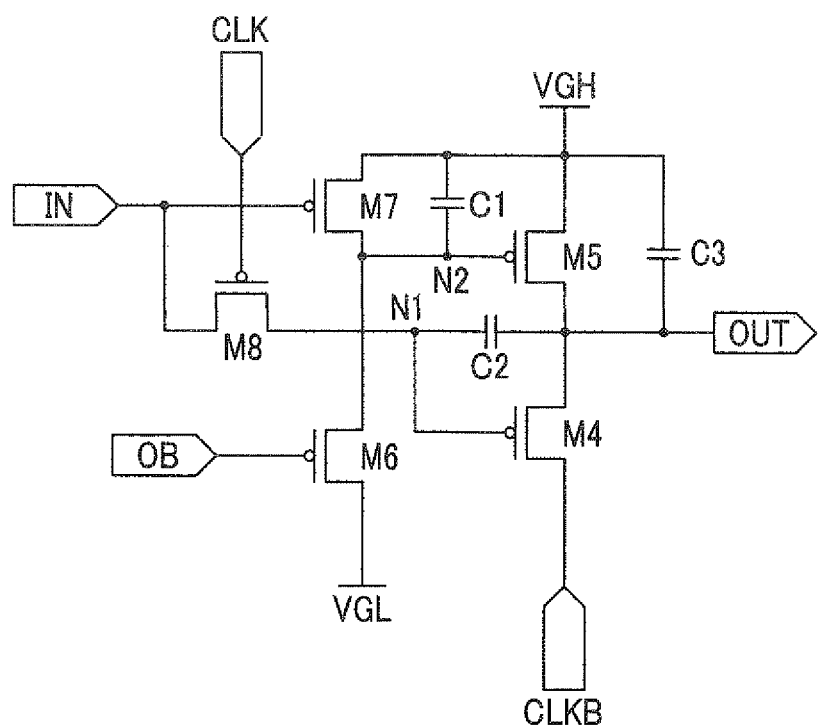
FIG. 4 is a circuit diagram of a scan driving block included in the scan driver of FIG. 3.

FIG. 4 is circuit diagram of a scan driving block included in the scan driver of FIG. 3.

Referring to FIG. 4, the scan driving block includes a plurality of input terminals CLK, CLKB, IN, and OB, a signal output terminal OUT, a plurality of transistors M4, M5, M6, M7, and M8, and a plurality of capacitors C1, C2, and C3. The plurality of input terminals include a first clock signal input terminal CLK, a second clock signal input terminal CLKB, a sequential input terminal IN, and an inverse-output input terminal OB.

The first transistor M4 includes a gate electrode connected to the first node N1, one terminal connected to the second clock signal input terminal CLKB, and another terminal connected to the signal output terminal OUT. The second transistor M5 includes a gate electrode connected to the second node N2, one terminal connected to the VGH power source, and another terminal connected to the signal output terminal OUT. The third transistor M6 includes the gate electrode connected to the inverse-output input terminal OB, one terminal connected to the VGL power source, and another terminal connected to the second node N2. The fourth transistor M7 includes a gate electrode connected to the sequential input terminal IN, one terminal connected to the VGH power source, and another terminal connected to the second node N2. The fifth transistor M8 includes a gate electrode connected to the first clock signal input terminal CLK, one terminal connected to the sequential input terminal IN, and another terminal connected to the first node N1.

The first capacitor C1 includes one terminal connected to the VGH power source and another terminal connected to the second node N2. The second capacitor C2 includes one terminal connected to the first node N1 and another terminal connected to the other terminal of the first transistor M4. The third capacitor C3 includes one terminal connected to the VGH power source and another terminal connected to the other terminal of the second transistor M5.

The first node N1 is connected to the gate electrode of the first transistor M4, the other terminal of the fifth transistor M8, and one terminal of the second capacitor C2. The second node N2 is connected to the gate electrode of the second transistor M5, the other terminal of the third transistor M6, the other terminal of the fourth transistor M7, and the other terminal of the first capacitor C1.

The VGH power source is a power source having a voltage of a logic high level, and the VGL power source is a power source having a voltage of a logic low level.

The first transistor M4 is turned on by receiving the signal applied to the sequential input terminal IN, and transmits the signal applied to the second clock signal input terminal CLKB to the signal output terminal OUT. The second transistor M5 is turned on by the VGL power source voltage and turned off by the VGH power source voltage, and transmits the VGH power source voltage to the signal output terminal OUT. The third transistor M6 has the signal applied to the inverse-output input terminal OB applied thereto, and transmits the VGL power source voltage to the gate electrode of the second transistor M5 so as to turn on the second transistor M5. The fourth transistor M7 receives the signal applied to the sequential input terminal IN, and transmits the VGH power source voltage to the gate electrode of the second transistor M5 so as to turn it off. The fifth transistor M8 is turned on by the signal applied to the first clock signal input terminal CLK, and transmits the signal applied to the sequential input terminal IN to the gate electrode of the first transistor M4.

The plurality of transistors M4, M5, M6, M7, and M8 are p-channel field effect transistors. The gate-on voltage for turning on the plurality of transistors M4, M5, M6, M7, and M8 is the voltage of the logic low level, and the gate-off voltage for turning them off is the voltage of the logic high level. At least one of the plurality of transistors M4, M5, M6, M7, and M8 may be an n-channel field effect transistor, and here, the gate-on voltage for turning on the n-channel field effect transistor is a voltage of a logic high level and the gate-off voltage for turning it off is a voltage of a logic low level.

The first clock signal SCLK (see FIG. 5) and the second clock signal SCLKB may have inverse-phase voltage levels. That is, when the first clock signal SCLK is applied as a voltage of the logic low level, the second clock signal SCLKB is applied as a voltage of the logic high level, and when the first clock signal SCLK is applied as a voltage of the logic high level, the second clock signal SCLKB is applied as a voltage of the logic low level.

When the first clock signal input terminal CLK has the voltage of the logic low level applied thereto, and the sequential input terminal IN has the voltage of the logic low level applied thereto, the fourth transistor M7 and the fifth transistor M8 are turned on. The voltage of the logic low level is transmitted to the first node N1 through the turned-on fifth transistor M8. The voltage of the logic low level of the first node N1 is transmitted to the gate electrode of the first transistor M4 so that the first transistor M4 is turned on. The voltage of the logic high level applied to the second clock signal input terminal CLKB through the turned-on first transistor M4 is transmitted to the signal output terminal OUT and is outputted.

In this regard, one terminal of the second capacitor C2 has the voltage of the logic low level applied thereto and the other terminal thereof is charged with the voltage of the logic high level, and the voltage of the logic low level is formed at the node N1. On the other hand, the VGH power source voltage is transmitted to the gate electrode of the second transistor M5 through the turned-on fourth transistor M7 such that the second transistor M5 is turned off. Also, the inverse-output input terminal OB has the voltage of the logic high level inputted thereto such that the third transistor M6 is in the turned-off state.

When the first clock signal input terminal CLKB has the voltage of the logic high level applied thereto and the sequential input terminal IN has the voltage of the logic high level applied thereto, the fourth transistor M7 and the fifth transistor M8 are turned off. The inverse-output input terminal OB has the voltage of the logic high level inputted thereto, such that the third transistor M6 is in the turned-off state. The voltage of the logic low level is formed at the first node N1 by the charged voltage to the second capacitor C2 such that the voltage of the logic low level of the first node N1 is transmitted to the gate electrode of the first transistor M4 so as to turn on the first transistor M4. The second capacitor C2 maintains the voltage of the first node N1. The voltage of the logic low level applied to the second clock signal input terminal CLKB through the turned-on first transistor M4 is transmitted to the signal output terminal OUT and is outputted.

When the voltage of the logic low level is applied to the inverse-output input terminal OB, the VGL power source voltage is transmitted to the second node N2. The voltage of the logic low level of the second node N2 is transmitted to the gate electrode of the second transistor M5 such that the second transistor M5 is turned on. The VGH power source voltage is transmitted to the signal output terminal OUT through the turned-on second transistor M5 and is outputted.

Figure 5:
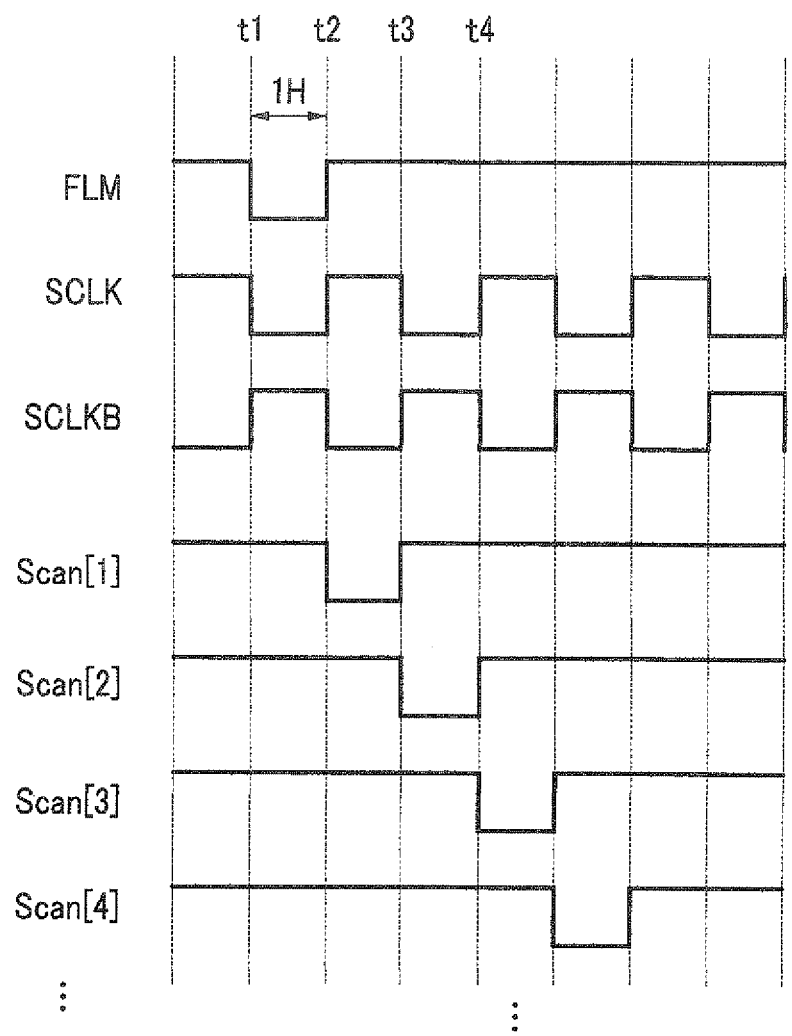
FIG. 5 is a timing diagram of a driving method of the scan driver of FIG. 3.

FIG. 5 is a timing diagram explaining a driving method of the scan driver of FIG. 3.

Referring to FIG. 3 thru 5, the first clock signal SCLK and the second clock signal SCLKB are applied in the inverse-phase voltage level as a unit of one horizontal cycle (1H), which is the same as the cycle of the horizontal synchronization signal Hsync and the data enable signal DE.

In the section t1-t2, the frame start signal FLM is applied to the sequential input terminal IN of the first scan driving block 210_1 as a voltage of the logic low level. Here, the first clock signal SCLK is applied as a voltage of the logic low level, and the second clock signal SCLKB is applied as a voltage of the logic high level. The first clock signal SCLK is inputted to the first clock signal input terminal CLK of first scan driving block 210_1, and the second clock signal SCLKB is applied to the second clock signal input terminal CLKB of the first scan driving block 210_1. The inverse-output input terminal OB has the voltage of the logic high level applied thereto. The first scan driving block 210_1 outputs the scan signal Scan of the logic high level.

In the section t2-t3, the frame start signal FLM as the voltage of the logic high level, the first clock signal SCLK as the voltage of the logic high level, and the second clock signal SCLKB as the voltage of the logic low level are applied. The second clock signal SCLKB, applied as the voltage of the logic low level through the turned-on first transistor M4 by the voltage of the logic low level formed as the first node N1, is transmitted to the signal output terminal OUT, and is outputted. That is, first scan driving block 210_1 outputs the scan signal Scan of the logic low level.

In the section t2-t3, the scan signal Scan of the logic low level of the first scan driving block 210_1 is transmitted to the second scan driving block 210_2. That is, the voltage of the logic low level is applied to the sequential input terminal IN of the second scan driving block 210_2. Here, the first clock signal input terminal CLK of the second scan driving block 210_2 is inputted with the second clock signal SCLKB of the logic low level, and the second clock signal input terminal CLKB is inputted with the first clock signal SCLK of the logic high level. Accordingly, the second scan driving block 210_2 outputs the scan signal Scan of the logic high level.

In the section t3-t4, the first clock signal SCLK of the logic low level, applied to the second clock signal input terminal CLKB of the second scan driving block 210_2, is transmitted to the signal output terminal OUT, and is outputted. That is, the second scan driving block 210_2 outputs the scan signal Scan of the logic low level. The scan signal Scan of the logic low level of the second scan driving block 210_2 is transmitted to the sequential input terminal IN of the third scan driving block 210_3 and the inverse-output input terminal OB of the first scan driving block 210_1. The first scan driving block 210_1 outputs the scan signal Scan of the logic high level by the scan signal Scan of the logic low level applied to the inverse-output input terminal OB.

By this method, a plurality of scan driving blocks 210_1, 210_2, 210_3, 210_4, . . . sequentially output the scan signals Scan, Scan, Scan, Scan, . . . of the logic low level.

The Scan Driver According to the Second Exemplary Embodiment

Figure 6:
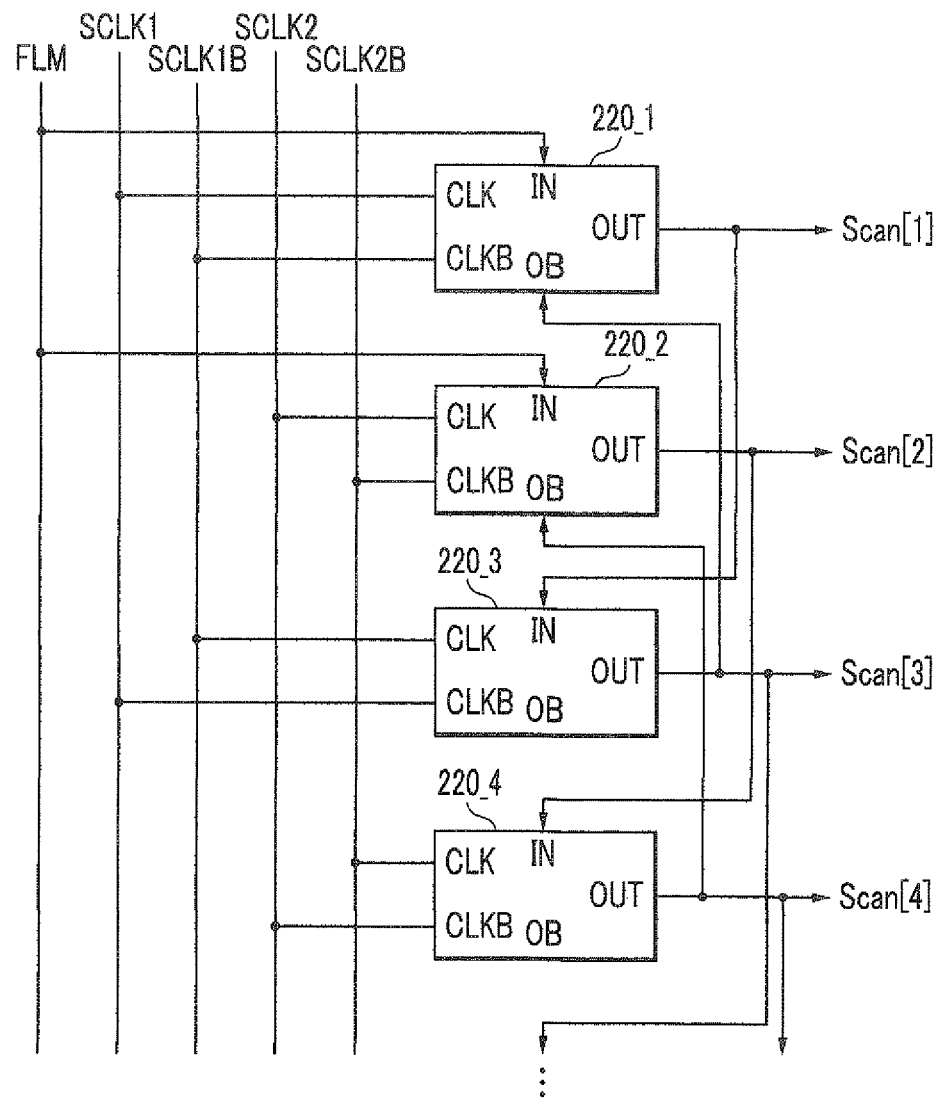
FIG. 6 is a block diagram of a scan driver according to another exemplary embodiment of the present invention.

FIG. 6 is a block diagram showing a configuration of a scan driver according to another exemplary embodiment of the present invention. The scan driver according to the second exemplary embodiment may be used as the scan driver 200 of FIG. 1. The differences with the scan driver of FIG. 3 according to the first exemplary embodiment will be described.

Referring to FIG. 6, the scan driver according to the second exemplary embodiment includes a plurality of scan driving blocks 220_1, 220_2, 220_3, 220_4, . . . for generating a plurality of scan signals. Each of the scan driving blocks 220_1, 220_2, 220_3, 220_4, . . . receives an input signal and generates the scan signals Scan[1], Scan[2], Scan[3], Scan[4], . . . respectively transmitted to the plurality of scan lines S1-Sn.

Each of the scan driving blocks 220_1, 220_2, 220_3, 220_4, . . . may be formed like the scan driving block of FIG. 4.

A plurality of clock signals includes the first clock signal SCLK1, the second clock signal SCLK1B, the third clock signal SCLK2, and the fourth clock signal SCLK2B. The plurality of clock signals SCLK1, SCLK1B, SCLK2, and SCLK2B are included in the scan control signal CONT1, and may be transmitted from the signal controller 100 to the scan driver 200. The plurality of clock signals SCLK1, SCLK1B, SCLK2, and SCLK2B and the frame start signal FLM are applied to the different wires.

The odd-numbered scan driving blocks 220_1, 220_3, . . . receive the first clock signal SCLK1 and the second clock signal SCLK1B, and the even-numbered scan driving blocks 220_2, 220_4, . . . receive the third clock signal SCLK2 and the fourth clock signal SCLK2B.

In the odd-numbered scan driving blocks 220_1, 220_3, . . . , the first clock signal input terminal CLK of one scan driving block is connected to the wire of the first clock signal SCLK1 and the second clock signal input terminal CLKB is connected to the wire of the second clock signal SCLK1B, while the first clock signal input terminal CLK of one other adjacent scan driving block is connected to the wire of the second clock signal SCLK1B and the second clock signal input terminal CLKB is connected to the wire of the first clock signal SCLK1.

In the even-numbered scan driving blocks 220_2, 220_4, . . . , the first clock signal input terminal CLK of one scan driving block is connected to the wire of the third clock signal SCLK2, and the second clock signal input terminal CLKB is connected to the wire of the fourth clock signal SCLK2B, while the first clock signal input terminal CLK of one other adjacent scan driving block is connected to the wire of the fourth clock signal SCLK2B, and the second clock signal input terminal CLKB is connected to the wire of the third clock signal SCLK2.

The sequential input terminals IN of the first scan driving block 220_1 and the second scan driving block 220_2 have the frame start signal FLM applied thereto, and the sequential input terminal IN of the other scan driving blocks 220_3, 220_4, . . . has the output signal of the scan driving block, which is previously arranged by two blocks applied thereto. For example, the sequential input terminal IN of the third scan driving block 220_3 is inputted with the output signal of the first scan driving block 220_1, and the sequential input terminal IN of the fourth scan driving block 220_4 is inputted with the outputted signal of the second scan driving block 220_2.

The inverse-output input terminal OB of each of the scan driving blocks 220_1, 220_2, 220_3, 220_4, . . . is inputted with the output signal of the scan driving block which is arranged later by two blocks. For example, the inverse-output input terminal OB of the first scan driving block 220_1 is inputted with the output signal of the third scan driving block 220_3, and the inverse-output input terminal OB of the second scan driving block 220_2 is inputted with the output signal of the fourth scan driving block 220_4.

Each of the scan driving blocks 220_1, 220_2, 220_3, 220_4, . . . outputs the scan signals Scan[1], Scan[2], Scan[3], Scan[4], . . . generated according to the signals inputted to the sequential input terminal IN, the first clock signal input terminal CLK, the second clock signal input terminal CLKB, and the inverse-output input terminal OB to the signal output terminal OUT. The plurality of scan driving blocks 220_1, 220_2, 220_3, 220_4, . . . sequentially output the scan signal of the gate-on voltage.

The first scan driving block 220_1 transmits the scan signal Scan[1] of the gate-on voltage, generated by receiving the frame start signal FLM, to the first scan line S1 and the third scan driving block 220_3. The second scan driving block 220_2 transmits the scan signal Scan[2] of the gate-on voltage, generated by receiving the frame start signal FLM, to the second scan line S2 and the fourth scan driving block 220_4. The third scan driving block 220_3 transmits the scan signal Scan[3] of the gate-on voltage, generated by receiving the scan signal Scan of the first scan driving block 220_1, to the third scan line S3, fifth scan driving block 220_5, and first scan driving block 220_1. That is, the (k+2)-th arranged scan driving block outputs the scan signal Scan[k+2] generated by receiving the scan signal Scan[k] outputted from the k-th arranged scan driving block, and the k-th arranged scan driving block receives the scan signal Scan[k+2] of the (k+2)-th arranged scan driving block, converts it into the level of the scan signal, and outputs it ($1<=k<n-1$). As described above, the scan signal is sequentially generated from the first scan driving block 220_1 to the n-th scan driving block 220_n (not shown), and is transmitted to the plurality of scan lines S1-Sn.

Figure 7:
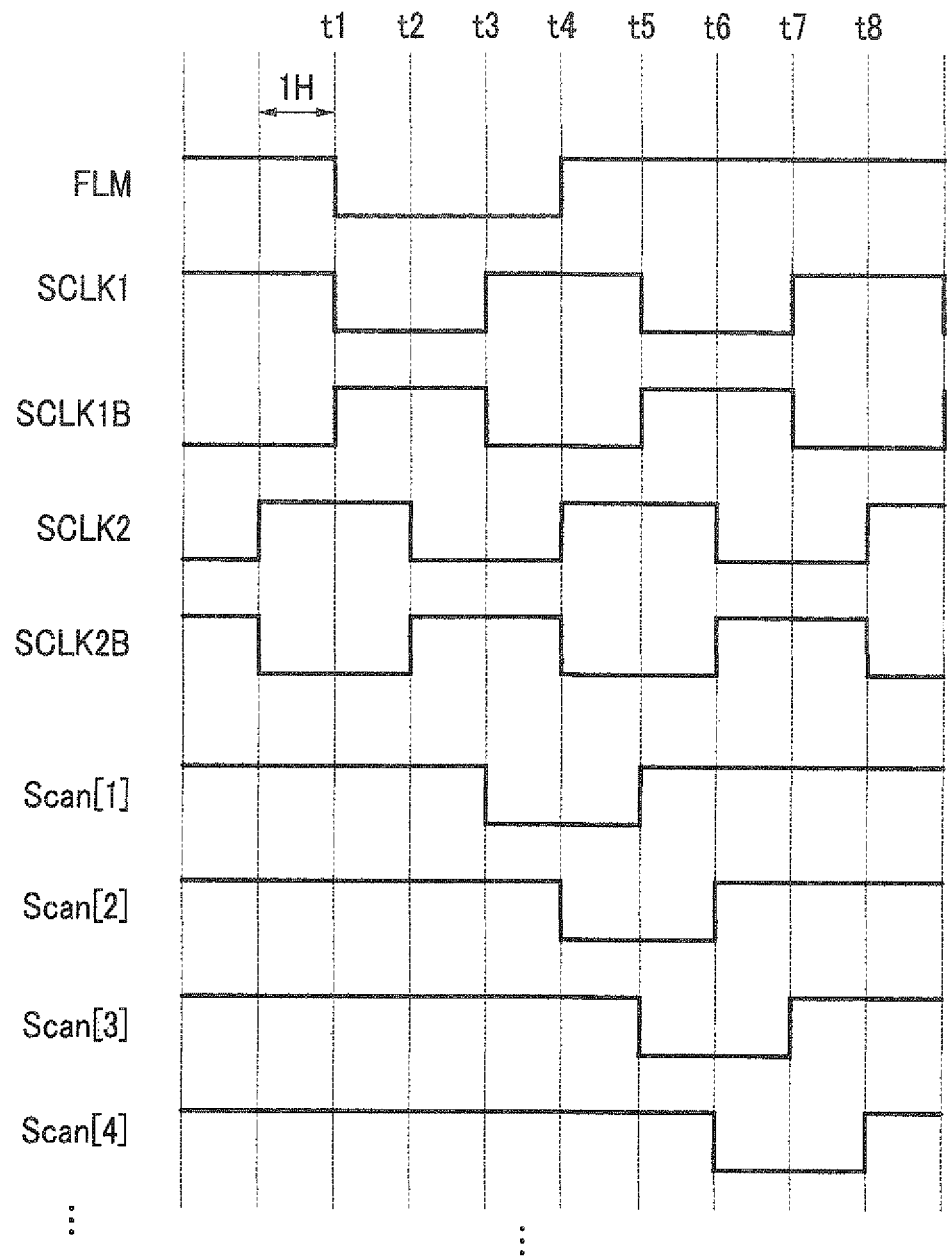
FIG. 7 is a timing diagram of the driving method of the scan driver shown in FIG. 6.

FIG. 7 is a timing diagram to explain the driving method of the scan driver of FIG. 6.

Referring to FIGS. 6 and 7, the voltage of the logic low level of each of the scan clock signals SCLK1, SCLK1B, SCLK2, and SCLK2B has a pulse width of two horizontal cycles 2H. The first clock signal SCLK1 and the second clock signal SCLK1B are applied with an inverse-phase voltage level of the unit of two horizontal cycles. The third clock signal SCLK2 and the fourth clock signal SCLK2B are applied with an inverse-phase voltage level of the unit of two horizontal cycles. The voltage levels of the first clock signal SCLK1 and the second clock signal SCLK1B overlap the voltage level of the third clock signal SCLK2 and the fourth clock signal SCLK2B by one horizontal cycle. For example, the first clock signal SCLK1 and the second clock signal SCLK1B are applied with a voltage of logic low level and logic high level, respectively, in the section t1-t3, and the third clock signal SCLK2 and the fourth clock signal SCLK2B are applied with a voltage of logic low level and logic high level, respectively, in the section t2-t4 which is later by one horizontal cycle.

The frame start signal FLM is applied with a voltage of logic low level during the section t1-t4.

In the section t1-t3, the frame start signal FLM as the voltage of logic low level is applied to the sequential input terminal IN of the first scan driving block 220_1. Here, the first clock signal SCLK1 as a voltage of logic low level and the second clock signal SCLK1B as a voltage of logic high level are applied. The first clock signal SCLK1 is inputted to the first clock signal input terminal CLK of the first scan driving block 220_1, and the second clock signal SCLK1B is applied to the second clock signal input terminal CLKB of the first scan driving block 220_1. The first scan driving block 220_1 outputs the scan signal Scan of logic high level.

In the section t3-t5, the frame start signal FLM is applied with a voltage of logic low level in the section t3-t4, and is applied with a voltage of logic high level in the section t4-t5. Also, the first clock signal SCLK1 is applied with a voltage of logic high level, and the second clock signal SCLK1B is applied with a voltage of logic low level. In the section t3-t4, although the frame start signal FLM is applied with a voltage of logic low level, the first clock signal SCLK1 is applied with a voltage of logic high level such that the voltage of logic low level formed at the first node N1 is not influenced. The second clock signal SCLKB, applied with a voltage of logic low level through the turned-on first transistor M4 by the voltage of logic low level formed at the first node N1, is transmitted to the signal output terminal OUT, and is outputted. That is, the first scan driving block 220_1 outputs the scan signal Scan of logic low level.

In the section t3-t5, the scan signal Scan of logic low level of the first scan driving block 220_1 is transmitted to the third scan driving block 220_3. That is, a voltage of logic low level is applied to the sequential input terminal IN of the third scan driving block 220_3. Here, the first clock signal input terminal CLK of the third scan driving block 220_3 is inputted with the second clock signal SCLK1B of logic low level, and the second clock signal input terminal CLKB is inputted with the first clock signal SCLK1 of logic high level. Accordingly, the third scan driving block 220_3 outputs the scan signal Scan of logic high level.

In the section t5-t7, the first clock signal SCLK1 of logic low level, applied to the second clock signal input terminal CLKB of the third scan driving block 220_3, is transmitted to the signal output terminal OUT, and is outputted. That is, the third scan driving block 220_3 outputs the scan signal Scan of logic low level. The scan signal Scan of logic low level of the third scan driving block 220_3 is transmitted to the sequential input terminal IN of the fifth scan driving block 220_5 and the inverse-output input terminal OB of the first scan driving block 220_1. The first scan driving block 220_1 outputs the scan signal Scan of logic high level by the scan signal Scan of logic low level applied to the inverse-output input terminal OB.

On the other hand, in the section t1-t2, the sequential input terminal IN of the second scan driving block 220_2 is inputted with the frame start signal FLM of logic low level, the first clock signal input terminal CLK is inputted with the third clock signal SCLK2 of logic high level, and the second clock signal input terminal CLKB is inputted with the fourth clock signal SCLK2B of logic low level. The first node N1 is not formed with the voltage of logic low level, and the first transistor M4 is turned off such that the fourth clock signal SCLK2B of logic low level is not transmitted to the signal output terminal OUT.

In the section t2-t4, the sequential input terminal IN of the second scan driving block 220_2 has the frame start signal FLM of logic low level applied thereto, the first clock signal input terminal CLK has the third clock signal SCLK2 of logic low level applied thereto, and the second clock signal input terminal CLKB has the fourth clock signal SCLK2B of logic high level applied thereto. The second scan driving block 220_2 outputs the scan signal Scan of logic high level.

In the section t4-t6, the sequential input terminal IN of the second scan driving block 220_2 has the frame start signal FLM of logic high level applied thereto, the first clock signal input terminal CLK has the third clock signal SCLK2 of logic high level applied thereto, and the second clock signal input terminal CLKB has the fourth clock signal SCLK2B of logic low level applied thereto. The second scan driving block 220_2 transmits the fourth clock signal SCLK2B of logic low level to the signal output terminal OUT so as to output the scan signal Scan of logic low level.

In the section t4-t6, the scan signal Scan of logic low level of the second scan driving block 220_2 is transmitted to the fourth scan driving block 220_4. That is, the sequential input terminal IN of the fourth scan driving block 220_4 has the voltage of logic low level applied thereto. Here, the first clock signal input terminal CLK of the fourth scan driving block 220_4 is inputted with the fourth clock signal SCLK2B of logic low level, and the second clock signal input terminal CLKB is inputted with the third clock signal SCLK1 of logic high level. Accordingly, the fourth scan driving block 220_4 outputs the scan signal Scan of logic high level.

In the section t6-t8, the third clock signal SCLK2 of logic low level, applied to the second clock signal input terminal CLKB of the fourth scan driving block 220_4, is transmitted to the signal output terminal OUT, and is outputted. That is, the fourth scan driving block 220_4 outputs the scan signal Scan of logic low level. The scan signal Scan of logic low level of the fourth scan driving block 220_4 is transmitted to the sequential input terminal IN of the sixth scan driving block 220_6 and the inverse-output input terminal OB of the second scan driving block 220_2. The second scan driving block 220_2 outputs the scan signal Scan of logic high level by means of the scan signal Scan of logic low level applied to the inverse-output input terminal OB.

As described above, the scan signals Scan[1], Scan[3], ... of the odd-numbered scan driving blocks 220_1, 220_3, ... and the scan signals Scan[2], Scan[4], ... of the even-numbered scan driving blocks 220_2, 220_4, ... overlap by one horizontal cycle, and are sequentially output while having the pulse width of two horizontal cycles.

The Scan Driver According to the Third Exemplary Embodiment

Figure 8:
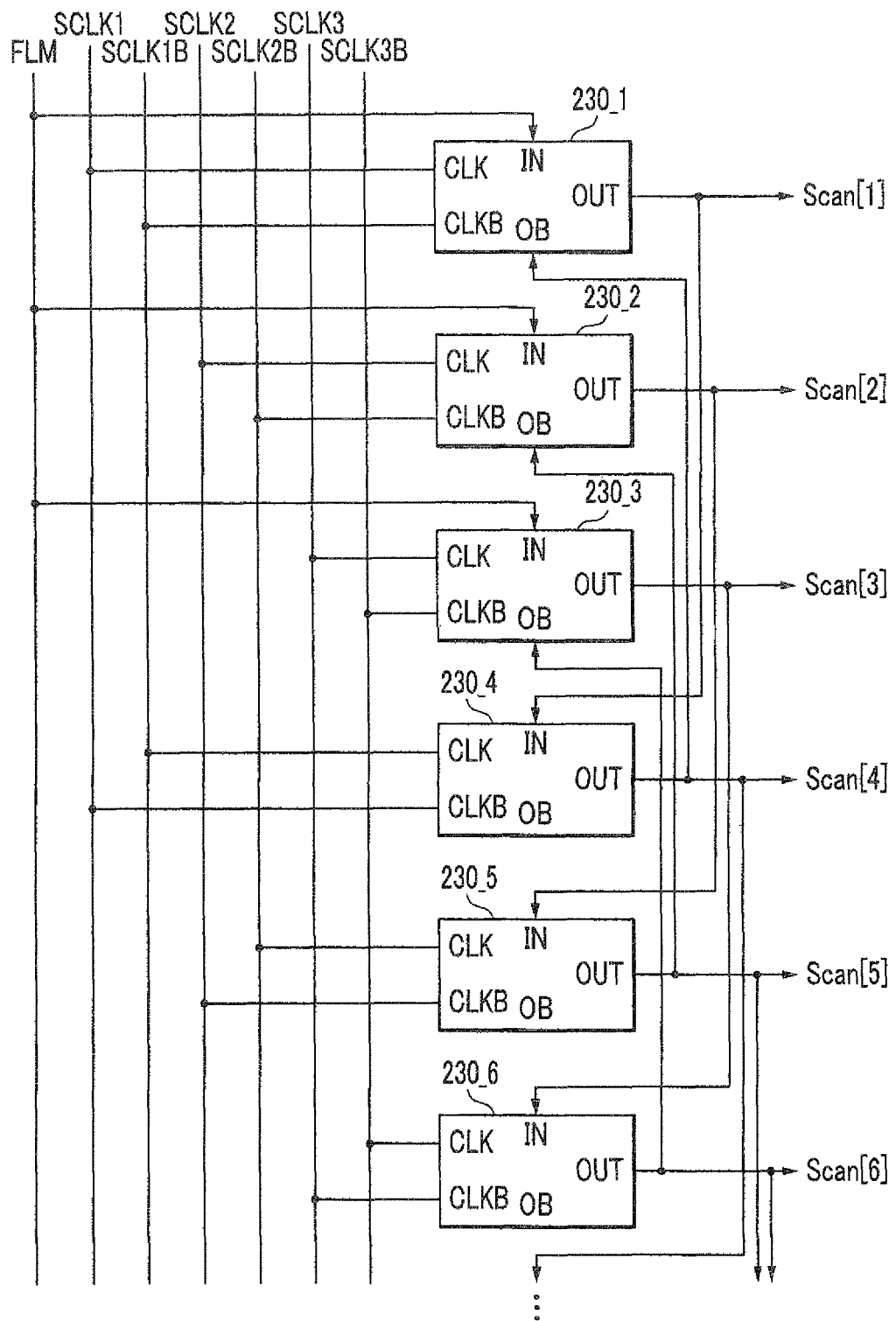
FIG. 8 is a block diagram of a configuration of a scan driver according to another exemplary embodiment of the present invention.

FIG. 8 is a block diagram of a configuration of a scan driver according to another exemplary embodiment of the present invention. The scan driver according to the third exemplary embodiment may be used as the scan driver 200 of FIG. 1. The differences compared with the scan driver of FIG. 3 according to the first exemplary embodiment or the scan driver of FIG. 6 according to the second exemplary embodiment will be described.

Referring to FIG. 8, the scan driver according to the third exemplary embodiment includes a plurality of scan driving blocks 230_1, 230_2, 230_3, 230_4, 230_5, 230_6, . . . generating a plurality of scan signals. Each of the scan driving blocks 230_1, 230_2, 230_3, 230_4, 230_5, 230_6, . . . receives an input signal so as to generate the scan signals Scan[1], Scan[2], Scan[3], Scan[4], Scan[5], Scan[6], . . . transmitted to the plurality of scan lines S1-Sn.

Each of the scan driving blocks 230_1, 230_2, 230_3, 230_4, 230_5, 230_6, . . . may have a configuration like that of the scan driving block of FIG. 4.

The plurality of clock signals includes the first clock signal SCLK1, the second clock signal SCLK1B, the third clock signal SCLK2, the fourth clock signal SCLK2B, the fifth clock signal SCLK3, and the sixth clock signal SCLK3B. The plurality of clock signals SCLK1, SCLK1B, SCLK2, SCLK2B, SCLK3, and SCLK3B are included in the scan control signal CONT1, and may be transmitted to the scan driver 200 in the signal controller 100. The plurality of clock signals SCLK1, SCLK1B, SCLK2, SCLK2B, SCLK3, and SCLK3B and the frame start signal FLM are connected with different wires.

The scan driving blocks 230_1, 230_4, . . . , which are arranged with three blocks from the first scan driving block 230_1 in the first group, are inputted with the first clock signal SCLK1 and the second clock signal SCLK1B. The scan driving blocks 230_2, 230_5, . . . , which are arranged with three blocks from the second scan driving block 230_2 in the second group are inputted with the third clock signal SCLK2 and the fourth clock signal SCLK2B, and the scan driving blocks 230_3, 230_6, . . . , which are arranged with three blocks from the third scan driving block 230_3 in the third group, are inputted with the fifth clock signal SCLK3 and the sixth clock signal SCLK3B.

In the scan driving blocks 230_1, 230_4, . . . of the first group, the first clock signal input terminal CLK of one scan driving block is connected to the wire of the first clock signal SCLK1, and the second clock signal input terminal CLKB is connected to the wire of the second clock signal SCLK1B, while the first clock signal input terminal CLK of one adjacent different scan driving block is connected to the wire of the second clock signal SCLK1B, and the second clock signal input terminal CLKB is connected to the wire of the first clock signal SCLK1.

In the scan driving blocks 230_2, 230_5, . . . of the second group, the first clock signal input terminal CLK of one scan driving block is connected to the wire of the third clock signal SCLK2, and the second clock signal input terminal CLKB is connected to the wire of the fourth clock signal SCLK2B, while the first clock signal input terminal CLK of one adjacent different scan driving block is connected to the wire of the fourth clock signal SCLK2B, and the second clock signal input terminal CLKB is connected to the wire of the third clock signal SCLK2.

In the scan driving blocks 230_3, 230_6, . . . of the third group, the first clock signal input terminal CLK of one scan driving block is connected to the wire of the fifth clock signal SCLK3, and the second clock signal input terminal CLKB is connected to the wire of the sixth clock signal SCLK3B, while the first clock signal input terminal CLK of one adjacent scan driving block is connected to the wire of the sixth clock signal SCLK3B, and the second clock signal input terminal CLKB is connected to the wire of the fifth clock signal SCLK3.

The sequential input terminals IN of the first scan driving block 230_1, the second scan driving block 230_2, and the third scan driving block 230_3 have the frame start signal FLM applied thereto, and the sequential input terminal IN of the other scan driving blocks 230_4, 230_5, 230_6, . . . have the output signal of the scan driving block, which is previously arranged by three blocks, applied thereto. For example, the sequential input terminal IN of the fourth scan driving block 230_4 is inputted with the output signal of the first scan driving block 230_1, the sequential input terminal IN of the fifth scan driving block 230_5 is inputted with the output signal of the second scan driving block 230_2, and the sequential input terminal IN of the sixth scan driving block 230_6 is inputted with the output signal of the third scan driving block 230_3.

The inverse-output input terminal OB of each of the scan driving blocks 230_1, 230_2, 230_3, 230_4, 230_5, 230_6, . . . is inputted with the output signal of the scan driving block which is arranged later by three blocks. For example, the inverse-output input terminal OB of the first scan driving block 230_1 is inputted with the output signal of the fourth scan driving block 230_4, the inverse-output input terminal OB of the second scan driving block 230_2 is inputted with the output signal of the fifth scan driving block 230_5, and the inverse-output input terminal OB of the third scan driving block 230_3 is inputted with the output signal of the sixth scan driving block 230_6.

The scan driving blocks 230_1, 230_2, 230_3, 230_4, 230_5, 230_6, . . . output the scan signal Scan[1], Scan[2], Scan[3], Scan[4], Scan[5], Scan[6], . . . generated according to the signals inputted to the sequential input terminal IN, the first clock signal input terminal CLK, the second clock signal input terminal CLKB, and the inverse-output input terminal OB, to the signal output terminal OUT. The plurality of scan driving blocks 230_1, 230_2, 230_3, 230_4, 230_5, 230_6, . . . sequentially output the scan signal of the gate-on voltage.

The first scan driving block 230_1 transmits the scan signal Scan of the gate-on voltage, generated by receiving the frame start signal FLM, to the first scan line S1 and the fourth scan driving block 230_4. The second scan driving block 230_2 transmits the scan signal Scan of the gate-on voltage, generated by receiving the frame start signal FLM, to the second scan line S2 and the fifth scan driving block 230_5. The third scan driving block 230_3 transmits the scan signal Scan of the gate-on voltage, generated by receiving the frame start signal FLM, to the third scan line S3 and the sixth scan driving block 230_6.

The fourth scan driving block 230_4 transmits the scan signal Scan of the gate-on voltage, generated by receiving the scan signal Scan of the first scan driving block 230_1, to the fourth scan line S4, the seventh scan driving block 220_7, and the first scan driving block 230_1. That is, the k+3-th arranged scan driving block outputs the scan signal Scan[k+1] generated by receiving the scan signal Scan[k] output from the k-th arranged scan driving block, and the k-th arranged scan driving block receives the scan signal Scan[k+3] of the (k+3)-th arranged scan driving block so as to convert and output the level of the scan signal (1<=k<n−2). As described above, the scan signal is sequentially generated from the first scan driving block 230_1 to the n-th scan driving block 230_n (not shown), and is transmitted to the plurality of scan lines S1-Sn.

Figure 9:
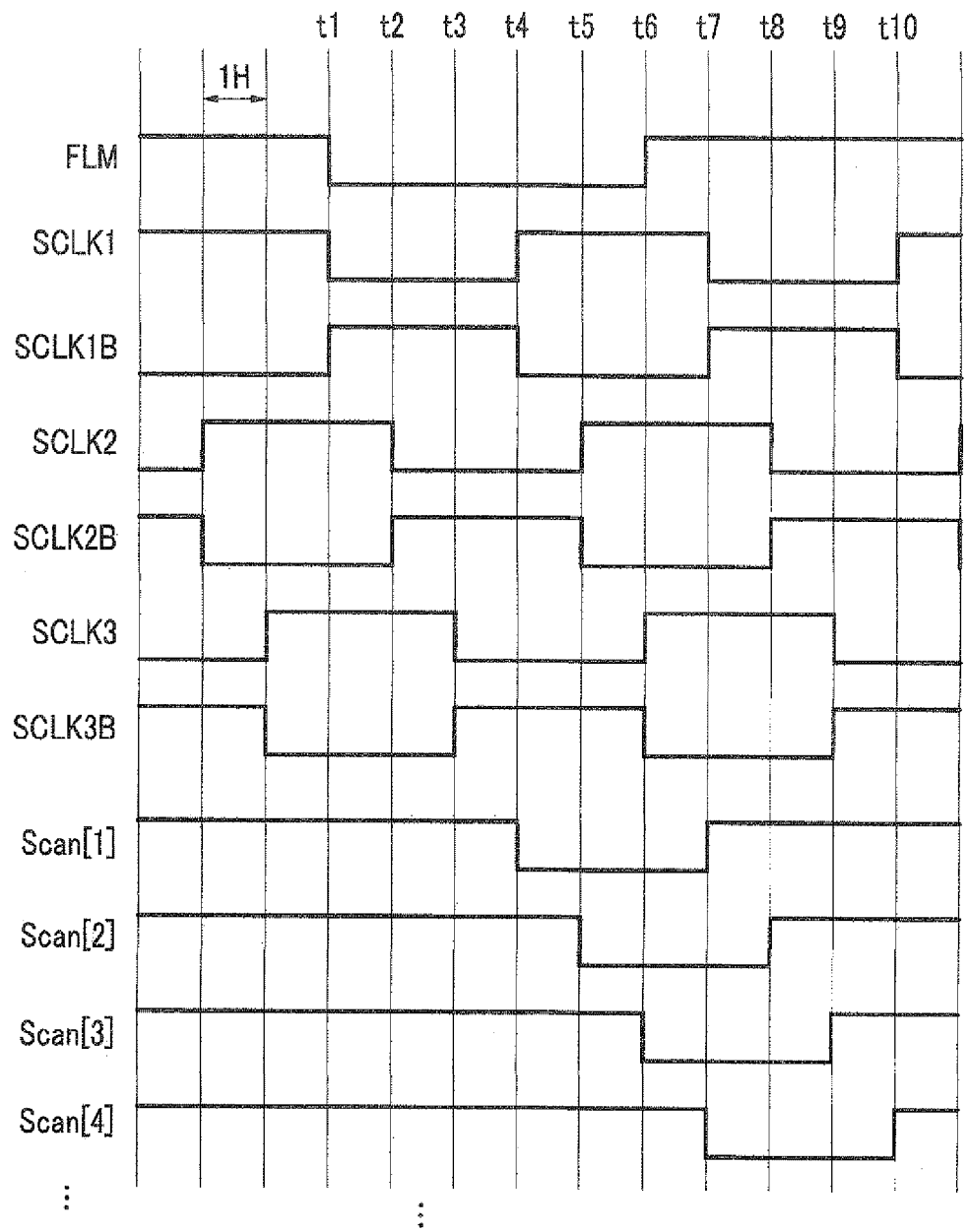
FIG. 9 is a timing diagram of a driving method of the scan driver of FIG. 8.

FIG. 9 is a timing diagram of a driving method of the scan driver of FIG. 8.

Referring to FIGS. 8 and 9, the voltage of logic low level of the scan clock signals SCLK1, SCLK1B, SCLK2, SCLK2B, SCLK3, and SCLK3B has a pulse width of three horizontal cycles 3H. The first clock signal SCLK1 and the second clock signal SCLK1B have the inverse-phase voltage level applied thereto as the unit of three horizontal cycles. The third clock signal SCLK2 and the fourth clock signal SCLK2B have the inverse-phase voltage level applied thereto as the unit of three horizontal cycles. The fifth clock signal SCLK3 and the sixth clock signal SCLK3B have the inverse-phase voltage level applied thereto as the unit of three horizontal cycles. The voltage levels of the first clock signal SCLK1 and the second clock signal SCLK1B overlap the voltage levels of the third clock signal SCLK2 and the fourth clock signal SCLK2B by one horizontal cycle, and the voltage levels of the third clock signal SCLK2 and the fourth clock signal SCLK2B overlap the voltage level of the fifth clock signal SCLK3 and the sixth clock signal SCLK3B by one horizontal cycle. For example, the first clock signal SCLK1 and the second clock signal SCLK1B have a voltage of logic low level and logic high level applied thereto in the section t1-t4, the third clock signal SCLK2 and the fourth clock signal SCLK2B have a voltage of logic low level and logic high level applied thereto in the section t2-t5 which is late by one horizontal cycle, and the fifth clock signal SCLK3 and the sixth clock signal SCLK3B have a voltage of logic low level and logic high level applied thereto in the section t3-t6 which is further late by one horizontal cycle.

The frame start signal FLM has the voltage of logic low level during the section t1-t6.

In the section t1-t4, the sequential input terminal IN of the first scan driving block 230_1 is inputted with the frame start signal FLM of logic low level, the first clock signal input terminal CLK is inputted with the first clock signal SCLK1 of logic low level, and the second clock signal input terminal CLKB is inputted with the second clock signal SCLK1B of logic high level. The first scan driving block 230_1 outputs the scan signal Scan[1] of logic high level.

In the section t4-t7, the first scan driving block 230_1 transmits the second clock signal SCLK1B, applied with a voltage of logic low level, to the signal output terminal OUT so as to output the scan signal Scan[1] of logic low level. The scan signal Scan[1] of logic low level of the first scan driving block 230_1 is transmitted to the fourth scan driving block 230_4, and the fourth scan driving block 220_4 outputs the scan signal Scan[4] of logic high level.

In the section t7-t10, the first clock signal SCLK1 of logic low level, applied to the second clock signal input terminal CLKB of the fourth scan driving block 230_4, is transmitted to the signal output terminal OUT and is outputted. That is, the fourth scan driving block 230_4 outputs the scan signal Scan[4] of logic low level. The scan signal Scan[4] of logic low level of the fourth scan driving block 230_4 is transmitted to the sequential input terminal IN of the seventh scan driving block 230_7 and the inverse-output input terminal OB of the first scan driving block 230_1. The first scan driving block 230_1 outputs the scan signal Scan[1] of logic high level means of the scan signal Scan of logic low level applied to the inverse-output input terminal OB.

On the other hand, in the section t2-t5, the sequential input terminal IN of the second scan driving block 230_2 has the frame start signal FLM of logic low level applied thereto, the first clock signal input terminal CLK has the third clock signal SCLK2 of logic low level applied thereto, and the second clock signal input terminal CLKB has the fourth clock signal SCLK2B of logic high level applied thereto. The second scan driving block 230_2 outputs the scan signal Scan[2] of logic high level.

In the section t5-t8, the first clock signal input terminal CLK of the second scan driving block 230_2 has the third clock signal SCLK2 of logic high level applied thereto, and the second clock signal input terminal CLKB has the fourth clock signal SCLK2B of logic low level applied thereto. The second scan driving block 230_2 transmits the fourth clock signal SCLK2B of logic low level to the signal output terminal OUT so as to output the scan signal Scan[2] of logic low level. The scan signal Scan[2] of logic low level of the second scan driving block 230_2 is transmitted to the sequential input terminal IN of the fifth scan driving block 230_5.

In the section t3-t6, the sequential input terminal IN of the third scan driving block 230_3 has the frame start signal FLM of logic low level applied thereto, the first clock signal input terminal CLK has the fifth clock signal SCLK3 of logic low level applied thereto, and the second clock signal input terminal CLKB has the sixth clock signal SCLK3B of logic high level applied thereto. The third scan driving block 230_3 outputs the scan signal Scan[3] of logic high level.

In the section t6-t9, the first clock signal input terminal CLK of the third scan driving block 230_3 has the fifth clock signal SCLK3 of logic high level applied thereto, and the second clock signal input terminal CLKB has the sixth clock signal SCLK3B of logic low level applied thereto. The third scan driving block 230_3 transmits the sixth clock signal SCLK3B of logic low level to the signal output terminal OUT so as to output the scan signal Scan[3] of logic low level. The scan signal Scan[3] of logic low level of the third scan driving block 230_3 is transmitted to the sequential input terminal IN of the sixth scan driving block 230_6.

As described above, the scan signals Scan[1], Scan[4], . . . of the scan driving blocks 230_1, 230_4, . . . of the first group, the scan signals Scan[2], Scan[5], . . . of the scan driving blocks 230_2, 230_5, . . . of the second group, and the scan signals Scan[3], Scan[6], . . . of the scan driving blocks 230_3, 230_6, . . . of the third group, having a pulse width of three horizontal cycles, overlap by one horizontal cycle and are sequentially outputted.

The Scan Driver According to the Fourth Exemplary Embodiment

Figure 10:
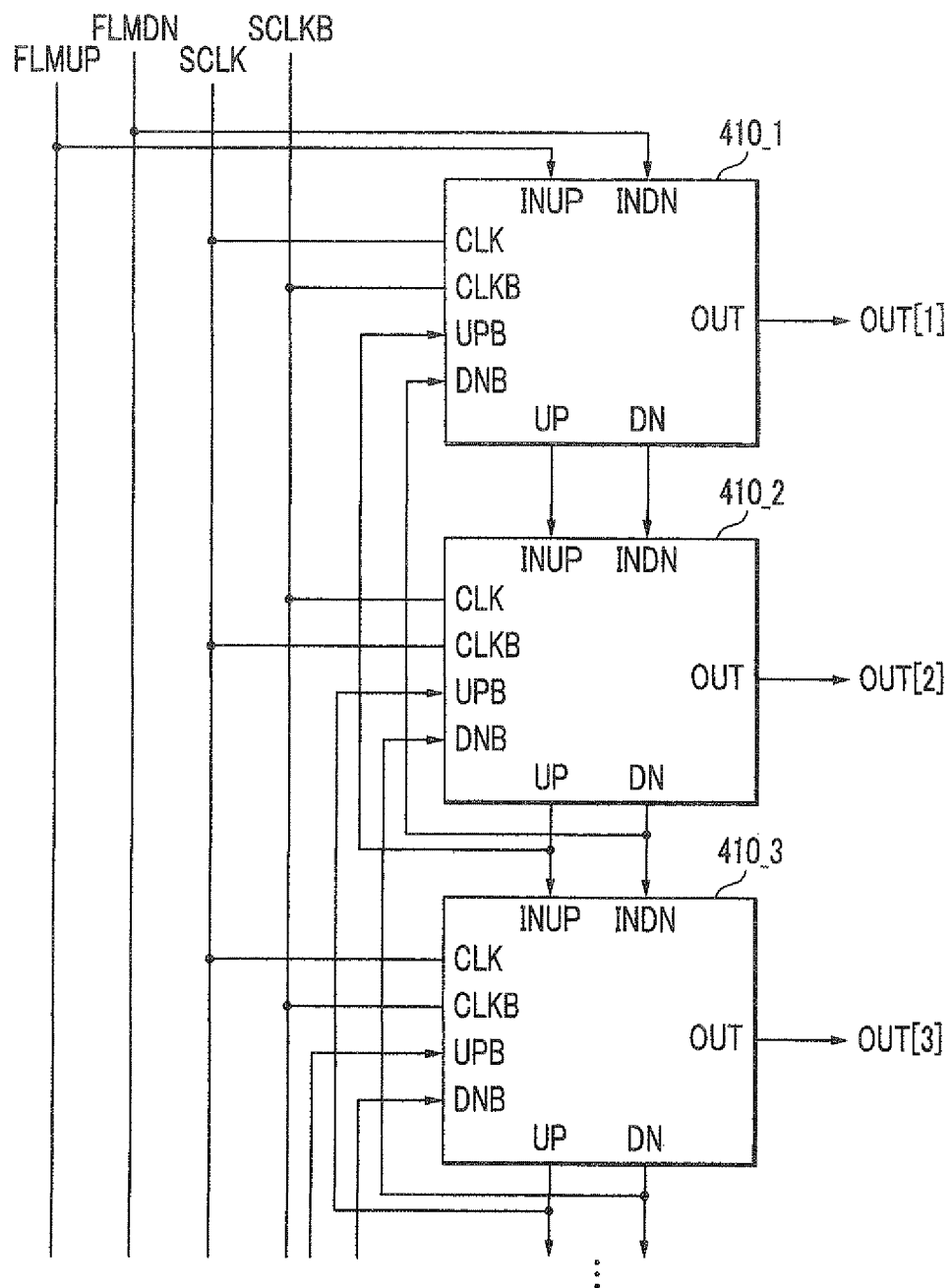
FIG. 10 is a block diagram of a configuration of a scan driver according to another exemplary embodiment of the present invention.

FIG. 10 is a block diagram of a configuration of a scan driver according to another exemplary embodiment of the present invention.

Referring to FIG. 10, the scan driver according to the fourth exemplary embodiment may be used as the scan driver 200 or the light emission driver 400 of FIG. 1.

The scan driver according to the fourth exemplary embodiment includes a plurality of scan driving blocks 410_1, 410_2, 410_3, . . . . The scan driving blocks 410_1, 410_2, 410_3, . . . receive an input signal so as to generate the output signals OUT[1], OUT[2], OUT[3], . . . .

The scan driving blocks 410_1, 410_2, 410_3, . . . respectively include the first clock signal input terminal CLK, the second clock signal input terminal CLKB, the first sequential input terminal INUP, the second sequential input terminal INDN, the first inverse-output input terminal UPB, the second inverse-output input terminal DNB, the first sequential output terminal UP, the second sequential output terminal DN, and the signal output terminal OUT.

The first clock signal input terminal CLK and the second clock signal input terminal CLKB are inputted with the first clock signal SCLK and the second clock signal SCLKB. The first clock signal input terminal CLK of the odd-numbered scan driving blocks 410_1, 410_3, . . . is connected to the wire of the first clock signal SCLK, and the second clock signal input terminal CLKB is connected to the wire of the second clock signal SCLKB. The first clock signal input terminal CLK of the even-numbered scan driving blocks 410_2, . . . is connected to the wire of the second clock signal SCLKB, and the second clock signal input terminal CLKB is connected to the wire of the first clock signal SCLK.

The first sequential input terminal INUP is inputted with the first frame start signal FLMUP or the output signal of the first sequential output terminal UP of the previous arranged scan driving block. The second sequential input terminal INDN is inputted with the second frame start signal FLMDN or the output signal of the second sequential output terminal DN of the previously arranged scan driving block. The first sequential input terminal INUP of the first scan driving block 410_1 has the first frame start signal FLMUP applied thereto, and the second sequential input terminal INDN has the second frame start signal FLMDN applied thereto. The first sequential input terminals INUP of the other scan driving blocks 410_2, 410_3, . . . have the output signal of the first sequential output terminal UP of the previous arranged scan driving block applied thereto, and the second sequential input terminal INDN has the output signal of the second sequential output terminal DN of the previous arranged scan driving block applied thereto.

The first inverse-output input terminal UPB is inputted with the output signal of the first sequential output terminal UP of the directly next arranged scan driving block. The second inverse-output input terminal DNB is inputted with the output signal of the second sequential output terminal DN of the directly next arranged scan driving block.

The scan driving blocks 410_1, 410_2, 410_3, . . . output the output signals OUT[1], OUT[2], OUT[3], . . . , generated according to the signals inputted to the first sequential input terminal INUP, the second sequential input terminal INDN, the first clock signal input terminal CLK, the second clock signal input terminal CLKB, the first inverse-output input terminal UPB, and the second inverse-output input terminal DNB, to the signal output terminal OUT.

The plurality of scan driving blocks 410_1, 410_2, 410_3, . . . may sequentially output or simultaneously output the output signals according to the type of input signal.

Figure 11:
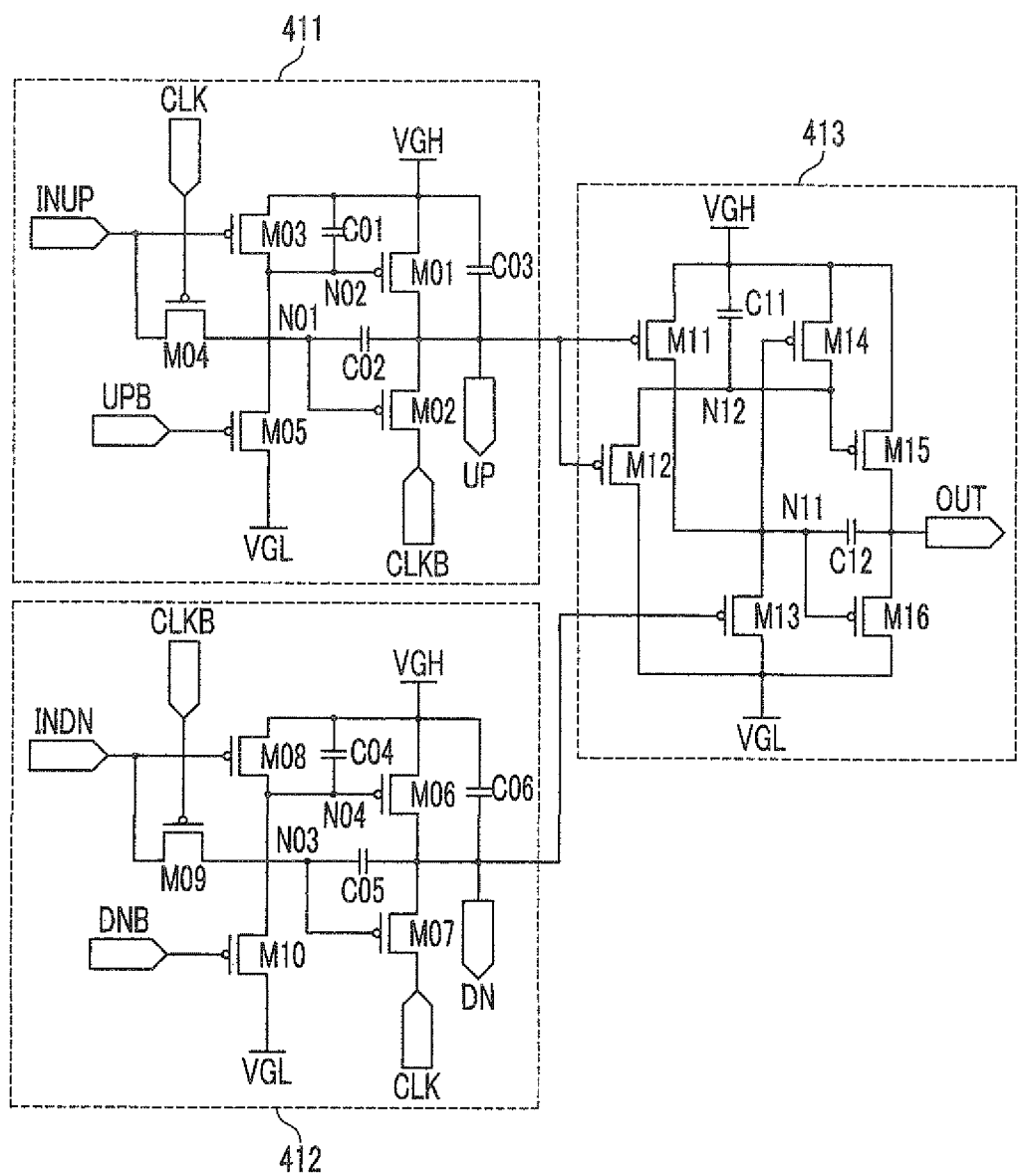
FIG. 11 is a circuit diagram of one example of a scan driving block included in the scan driver of FIG. 10.

FIG. 11 is a circuit diagram of one example of the scan driving block included in the scan driver of FIG. 10.

Referring to FIG. 11, the scan driving block includes a first input block 411, a second input block 412, and an output block 413. The first input block 411 includes the first sequential input terminal INUP, the first clock signal input terminal CLK, the second clock signal input terminal CLKB, the first inverse-output input terminal UPB, the first sequential output terminal UP, a plurality of transistors M01, M02, M03, M04, and M05, and a plurality of capacitors C01, C02, and C03. The second input block 412 includes the second sequential input terminal INDN, the first clock signal input terminal CLK, the second clock signal input terminal CLKB, the second inverse-output input terminal DNB, the second sequential output terminal DN, a plurality of transistors M06, M07, M08, M09, and M10, and a plurality of capacitors C04, C05, and C06. The output block 413 includes a signal output terminal OUT, a plurality of transistors M11, M12, M13, M14, M15, and M16, and a plurality of capacitors C11 and C12.

In the first input block 411, the first transistor M01 includes a gate electrode connected to the second node N01, one terminal connected to the VGH power source, and another terminal connected to the first sequential output terminal UP. The second transistor M02 includes a gate electrode connected to the first node N01, one terminal connected to the second clock signal input terminal CLKB, and another terminal connected to the first sequential output terminal UP. The third transistor M03 includes a gate electrode connected to the first sequential input terminal INUP, one terminal connected to the VGH power source, and another terminal connected to the second node N02. The fourth transistor M04 includes a gate electrode connected to the first clock signal input terminal CLK, one terminal connected to the first sequential input terminal INUP, and another terminal connected to the first node N01. The fifth transistor M05 includes a gate electrode connected to the first inverse-output input terminal UPB, one terminal connected to the VGL power source, and another terminal connected to the second node N02. The first capacitor C01 includes one terminal connected to the VGH power source and another terminal connected to the second node N02. The second capacitor C02 includes one terminal connected to the first node N01 and another terminal connected to the first sequential output terminal UP. The third capacitor C03 includes one terminal connected to the VGH power source and another terminal connected to the first sequential output terminal UP. The first node N01 is connected to the gate electrode of the second transistor M02, the other terminal of the fourth transistor M04, and one terminal of the second capacitor C02. The second node N02 is connected to the gate electrode of the first transistor M01, the other terminal of the third transistor M03, the other terminal of the fifth transistor M05, and the other terminal of the first capacitor C01.

In the second input block 412, the first transistor M06 includes a gate electrode connected to the second node N04, one terminal connected to the VGH power source, and another terminal connected to the second sequential output terminal DN. The second transistor M07 includes a gate electrode connected to the first node N03, one terminal connected to the first clock signal input terminal CLK, and another terminal connected to the second sequential output terminal DN. The third transistor M08 includes a gate electrode connected to the second sequential input terminal INDN, one terminal connected to the VGH power source, and another terminal connected to the second node N04. The fourth transistor M09 includes a gate electrode connected to the second clock signal input terminal CLKB, one terminal connected to the second sequential input terminal INDN, and another terminal connected to the first node N03. The fifth transistor M10 includes a gate electrode connected to the second inverse-output input terminal DNB, one terminal connected to the VGL power source, and another terminal connected to the second node N04. The first capacitor C04 includes one terminal connected to the VGH power source and another terminal connected to the second node N04. The second capacitor C05 includes one terminal connected to the first node N03 and another terminal connected to the second sequential output terminal DN. The third capacitor C06 includes one terminal connected to the VGH power source and another terminal connected to the second sequential output terminal DN. The first node N03 is connected to the gate electrode the second transistor M07, the other terminal of the fourth transistor M09, and one terminal of the second capacitor C05. The second node N04 is connected to the gate electrode of the first transistor M06, the other terminal of the third transistor M08, the other terminal of the fifth transistor M10, and the other terminal of the first capacitor C04.

In the output block 413, the first transistor M11 includes a gate electrode connected to the first sequential output terminal UP, one terminal connected to the VGH power source, and another terminal connected to the first node N11. The second transistor M12 includes a gate electrode connected to the first sequential output terminal UP, one terminal connected to VGL power source, and another terminal connected to the second node N12. The third transistor M13 includes a gate electrode connected to the second sequential output terminal DN, one terminal connected to the VGL power source, and another terminal connected to the first node N11. The fourth transistor M14 includes a gate electrode connected to the first node N11, one terminal connected to the VGH power source, and another terminal connected to the second node N12. The fifth transistor M15 includes a gate electrode connected to the second node N12, one terminal connected to the VGH power source, and another terminal connected to the signal output terminal OUT. The sixth transistor M16 includes a gate electrode connected to the first node N11, one terminal connected to the VGL power source, and another terminal connected to the signal output terminal OUT. The first capacitor C11 includes one terminal connected to the VGH power source and another terminal connected to the second node N12. The second capacitor C12 includes one terminal connected to the first node N11 and the other terminal connected to the signal output terminal OUT. The first node N11 is connected to another terminal of the first transistor M11, the other terminal of the third transistor M13, the gate electrode of the sixth transistor M16, and one terminal of the second capacitor C12. The second node N12 is connected to the other terminal of the second transistor M12, the other terminal of the fourth transistor M14, the gate electrode of the fifth transistor M15, and the other terminal of the first capacitor C11.

The output block 413 receives output signals of the first input block 411 and the second input block 412 so as to output the output signal of a logic high level or a logic low level of a predetermined pulse width. The gate electrode of the first transistor M11 is connected to the first sequential output terminal UP of the first input block 411 so as to output the VGH power source voltage. The gate electrode of the second transistor M12 is connected to the first sequential output terminal UP of the first input block 411 so as to output the VGL power source voltage. The gate electrode of the third transistor M13 is connected to the second sequential output terminal DN of the second input block 412 so as to output the VGL power source voltage The gate electrode of the fourth transistor M14 is connected to the VGL power source through the third transistor M13, and is connected to the VGH power source through the first transistor M11. The gate electrode of the fifth transistor M15 is connected to the VGL power source through the second transistor M12, and is connected to the VGH power source through the fourth transistor M14. The gate electrode of the sixth transistor M16 is connected to the VGH power source through the first transistor M11, and is connected to the VGL power source through the third transistor M13. The VGH power source voltage is transmitted to the signal output terminal OUT through the fifth transistor M15, and the VGL power source voltage is transmitted to the signal output terminal OUT through the sixth transistor M16, and is outputted.

The VGH power source is a power source having a voltage of logic high level, and the VGL power source is a power source having a voltage of logic low level.

The plurality of transistors M01, M02, M03, M04, M05, M06, M07, M08, M09, M10, M11, M12, M13, M14, M15 and M16 are p-channel field effect transistors. The gate-on voltage for turning on the plurality of transistors M01, M02, M03, M04, M05, M06, M07, M08, M09, M10, M11, M12, M13, M14, M15 and M16 is a voltage of logic low level, and the gate-off voltage for turning them off is a voltage of logic high level. At least one of the plurality of transistors M01, M02, M03, M04, M05, M06, M07, M08, M09, M10, M11, M12, M13, M14, M15 and M16 may be an n-channel field effect transistor. The gate-on voltage turning on the n-channel field effect transistor is a voltage of logic high level, and the gate-off voltage turning it off is a voltage of logic low level.

Figure 12:
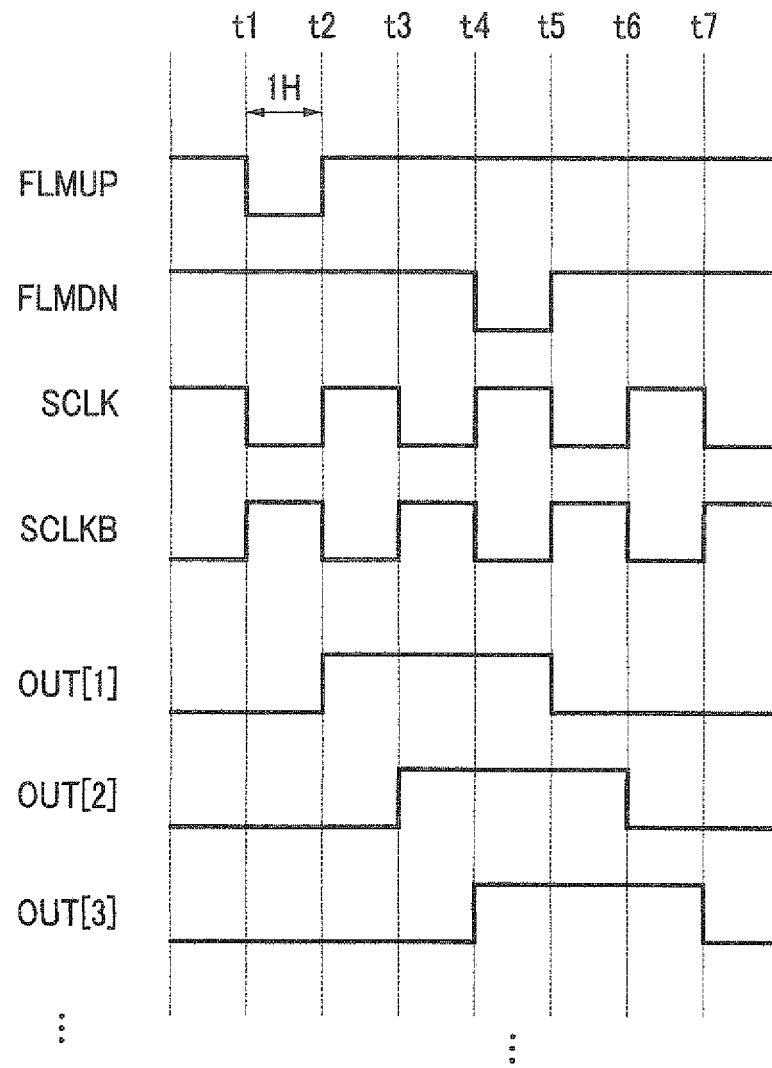
FIG. 12 is a timing diagram to explain a driving method of the scan driver of FIG. 10 according to an exemplary embodiment of the present invention.

FIG. 12 is a timing diagram to explain the driving method of the scan driver of FIG. 10 according to an exemplary embodiment of the present invention. The scan driver according to the fourth exemplary embodiment may be used in connection with the driving method of the light emission driver 400 of FIG. 1.

Referring to FIGS. 10 to 12, the first frame start signal FLMUP has a voltage of logic low level applied thereto in the section t1-t2, and the second frame start signal FLMDN has a voltage of logic low level applied thereto in the section t4-t5.

In the section t1-t2, the first sequential input terminal INUP of the first scan driving block 410_1 is inputted with the first frame start signal FLMUP of logic low level, the second sequential input terminal INDN is inputted with the second frame start signal FLMDN of logic high level, the first clock signal input terminal CLK is inputted with the first clock signal SCLK of logic low level, and the second clock signal input terminal CLKB is inputted with the second clock signal SCLKB of logic high level.

For the first input block 411 of the first scan driving block 410_1 in the section t1-t2, the third transistor M03 and the fourth transistor M04 are turned on, the VGH power source voltage is transmitted to the second node N02 through the turned-on third transistor M03, and the first frame start signal FLMUP of logic low level is transmitted to the first node N01 through the turned-on fourth transistor M04. The voltage of logic low level transmitted to the first node N01 turns on the second transistor M02, and the second clock signal SCLKB of logic high level is transmitted to the first sequential output terminal UP through the turned-on second transistor M02. Here, one terminal of the second capacitor C02 has a voltage of logic low level applied thereto and the other terminal has a voltage of logic high level applied thereto so as to be charged.

For the second input block 412 of the first scan driving block 410_1 in the section t1-t2, the second transistor M07 is in the turned-off state, and the third transistor M08 and the fourth transistor M09 are also turned off. For the output block 413 of the first scan driving block 410_1 in the section t1-t2, the first transistor M11 and the second transistor M12 are turned off by the voltage of logic high level transmitted to the first sequential output terminal UP.

In the section t2-t3, the first sequential input terminal INUP of the first scan driving block 410_1 is inputted with the first frame start signal FLMUP of logic high level, the second sequential input terminal INDN is inputted with the second frame start signal FLMDN of logic high level input, the first clock signal input terminal CLK is inputted with the first clock signal SCLK of logic high level, and the second clock signal input terminal CLKB is inputted with the second clock signal SCLKB of logic low level.

For the first input block 411 of the first scan driving block 410_1 in the section t2-t3, the third transistor M03 and the fourth transistor M04 are turned off and the second transistor M02 is turned on by the voltage of logic low level formed at the first node N01 by the voltage charged in the second capacitor C02. The second clock signal SCLKB of logic low level is transmitted to the first sequential output terminal UP through the turned-on second transistor M02.

For the output block 413 of the first scan driving block 410_1 in the section t2-t3, the voltage of logic low level transmitted to the first sequential output terminal UP turns on the first transistor M11 and the second transistor M12. The VGH power source voltage is transmitted to the first node N11 through the turned-on first transistor M11, and the VGL power source voltage is transmitted to the second node N12 through the turned-on second transistor M12. The voltage of logic high level of the first node N11 turns off the sixth transistor M16. The voltage of logic low level of the second node N12 turns on the fifth transistor M15, and the VGH power source voltage is transmitted to the signal output terminal OUT through the turned-on fifth transistor M15. Here, one terminal of the first capacitor C11 has the VGH power source voltage applied thereto and the other terminal has the VGL power source voltage applied thereto so as to be charged. As described above, the first scan driving block 410_1 outputs the output signal OUT of logic high level in the section t2-t3.

On the other hand, in the section t2-t3, the first sequential input terminal INUP of the second scan driving block 410_2 has the voltage of logic low level, outputted from the first sequential output terminal UP of the first scan driving block 410_1, applied thereto. The first clock signal input terminal CLK has the second clock signal SCLKB of logic low level applied thereto, and the second clock signal input terminal CLKB has the first clock signal SCLK of logic high level applied thereto. Accordingly, the second scan driving block 410_2 in the section t2-t3 receives a signal having the same waveform as the signal inputted to the first scan driving block 410_1 in the section t1-t2 so that it is equally operated.

Also, the second scan driving block 410_2 in the section t3-t4 receives the signal having the same waveform as the signal inputted to the first scan driving block 410_1 in the section t2-t3 so that it is equally operated. That is, the second scan driving block 410_2 is delayed relative to the first scan driving block 410_1 by one horizontal cycle, and is operated. The k scan driving block is delayed relative to the k−1 scan driving block by one horizontal cycle, and is operated. The second scan driving block 410_2 outputs the output signal of logic low level to the first sequential output terminal UP in the section t3-t4.

In the section t3-t4, the first sequential input terminal INUP of the first scan driving block 410_1 is inputted with the first frame start signal FLMUP of logic high level, the second sequential input terminal INDN is inputted with the second frame start signal FLMDN of logic high level, the first clock signal input terminal CLK is inputted with the first clock signal SCLK of logic low level, and the second clock signal input terminal CLKB is inputted with the second clock signal SCLKB of logic high level.

For the first input block 411 of the first scan driving block 410_1 in the section t3-t4, the third transistor M03 is turned off and the fourth transistor M04 is turned on. The first frame start signal FLMUP of logic high level is transmitted to the first node N01 through the turned-on fourth transistor M04 so that the second transistor M02 is turned off. Accordingly, the second clock signal SCLKB of logic high level is not transmitted to the first sequential output terminal UP. Here, the signal of logic low level outputted from the first sequential output terminal UP of the second scan driving block 410_2 is transmitted to the first inverse-output input terminal UPB. The fifth transistor M05 is turned on, and the VGL power source voltage is transmitted to the second node N02 through the turned-on fifth transistor M05 so that the first transistor M01 is turned on. The VGH power source voltage is transmitted to the first sequential output terminal UP through the turned-on first transistor M01.

The first transistor M11 and the second transistor M12 of the output block 413 of the first scan driving block 410_1 are turned off in the section t3-t4. Here, the voltage of logic low level of the second node N12, formed by the voltage charged in the first capacitor C11, turns on the fifth transistor M15, and the VGH power source voltage is transmitted to the signal output terminal OUT through the turned-on fifth transistor M15. That is, the first scan driving block 410_1 outputs output signal OUT of logic high level in the section t3-t4.

In the section t4-t5, the first sequential input terminal INUP of the first scan driving block 410_1 is inputted with the first frame start signal FLMUP of logic high level, the second sequential input terminal INDN is inputted with the second frame start signal FLMDN of logic low level, the first clock signal input terminal CLK is inputted with the first clock signal SCLK of logic high level, and the second clock signal input terminal CLKB is inputted with the second clock signal SCLKB of logic low level.

For the second input block 412 of the first scan driving block 410_1 in the section t4-t5, the third transistor M08 and the fourth transistor M09 are turned on, the VGH power source voltage is transmitted to the second node N04 through the turned-on third transistor M08, and the second frame start signal FLMDN of logic low level is transmitted to the first node N03 through the turned-on fourth transistor M09. The second transistor M07 is turned on by the voltage of logic low level of the first node N03, and the first clock signal SCLK of logic high level is transmitted to the second sequential output terminal DN through the turned-on second transistor M07. Here, one terminal of the second capacitor C05 has a voltage of logic low level applied thereto and the other terminal has a voltage of logic high level applied thereto so as to be charged. The voltage of logic high level transmitted to the second sequential output terminal DN turns off the third transistor M13 of the output block 413.

The first input block 411 of the first scan driving block 410_1 in the section t4-t5 transmits the second clock signal SCLKB of logic low level to the first sequential output terminal UP, as in the section t2-t3. The output block 413 transmits the VGH power source voltage to the output terminal OUT, as in the section t2-t3. That is, the first scan driving block 410_1 outputs output signal OUT of logic high level in the section t4-t5.

In the section t5-t6, the first sequential input terminal INUP of the first scan driving block 410_1 is inputted with the first frame start signal FLMUP of logic high level, the second sequential input terminal INDN is inputted with the second frame start signal FLMDN of logic high level, the first clock signal input terminal CLK is inputted with the first clock signal SCLK of logic low level, and the second clock signal input terminal CLKB is inputted with the second clock signal SCLKB of logic high level.

In the section t5-t6, for the first input block 411 of the first scan driving block 410_1, the third transistor M03 is turned off and the fourth transistor M04 is turned on, and the voltage of logic high level is transmitted to the first node N01 through the turned-on fourth transistor M04 such that the second transistor M02 is turned off. Here, the second scan driving block 410_2 in the section t5-t6 outputs the voltage of logic low level to the first sequential output terminal UP as with the first scan driving block 410_1 in the section t4-t5, and the voltage of logic low level output from the first sequential output terminal UP of the second scan driving block 410_2 is applied to the first inverse-output input terminal UPB of the first scan driving block 410_1. The fifth transistor M05 is turned on, and the VGL power source voltage is transmitted to the second node N02 through the turned-on fifth transistor M05. The voltage of logic low level of the second node N02 turns-on the first transistor M01, and the VGH power source voltage is transmitted to the first sequential output terminal UP through the turned-on first transistor M01.

In the section t5-t6, for the second input block 412 of the first scan driving block 410_1, the third transistor M08 and the fourth transistor M09 are turned off, and the second transistor M07 is turned on by the voltage formed at the first node N03 by the voltage charged in the second capacitor C05. The second clock signal SCLKB of logic low level is transmitted to the second sequential output terminal DN through the turned-on second transistor M07.

In the section t5-t6, for the output block 413 of the first scan driving block 410_1, the voltage of logic high level of the first sequential output terminal UP turns off the first transistor M11 and the second transistor M12, and the voltage of logic low level of the second sequential output terminal DN turns on the third transistor M13. The VGL power source voltage is transmitted to the first node N11 through the turned-on third transistor M13, and the voltage of logic low level of the first node N11 turns on the sixth transistor M16. The VGL power source voltage is transmitted to signal output terminal OUT through the turned-on sixth transistor M16 and is outputted. That is, the first scan driving block 410_1 outputs the output signal OUT of logic low level in the section t5-t6.

As described above, the first scan driving block 410_1 outputs the output signal OUT of logic high level during the section t2-t5 and the output signal OUT of logic low level from the time t5. The second scan driving block 410_2 outputs the output signal OUT of logic high level during the section t3-t6, which is delayed by one horizontal cycle for the output signal OUT of first scan driving block 410_1, and outputs the output signal OUT of logic low level from the time t6. The third scan driving block 410_3 outputs the output signal OUT of logic high level during the section t4-t7, which is delayed by one horizontal cycle for the output signal OUT of the second scan driving block 410_2, and the output signal OUT of logic low level from the time t7.

By this method, the plurality of scan driving blocks 410_1, 410_2, 410_3, . . . sequentially output the output signals OUT[1], OUT[2], OUT[3], . . . to the n-th scan driving block.

When the plurality of scan driving blocks 410_1, 410_2, 410_3, . . . are used as the light emission driver 400 of FIG. 1, the section where the output signal of logic high level is outputted becomes the scan section where the pixel is written with the data, and the next section where the output signal of logic low level is outputted is the sustain section where the pixel emits light.

When the interval in which the first frame start signal FLMUP of logic low level and the second frame start signal FLMDN are applied is 3H, the pulse width of the output signals OUT[1], OUT[2], OUT[3], . . . of logic high level outputted from the plurality of scan driving blocks 410_1, 410_2, 410_3, . . . is 3H. When the interval wherein the first frame start signal FLMUP of logic low level and the second frame start signal FLMDN are applied is N, the pulse width PW of the output signals OUT[1], OUT[2], OUT[3], . . . outputted from the plurality of scan driving blocks 410_1, 410_2, 410_3, . . . is 2N+1H (N=0, 1, 2, . . . ). That is, the first frame start signal FLMUP of logic low level and the second frame start signal FLMDN are adjusted so that the pulse width of the output signals OUT[1], OUT[2], OUT[3], . . . of logic high level outputted from the plurality of scan driving blocks 410_1, 410_2, 410_3, . . . may be adjusted, and thereby the duty of the section where the output signal of logic low level is outputted may be adjusted.

Figure 13:
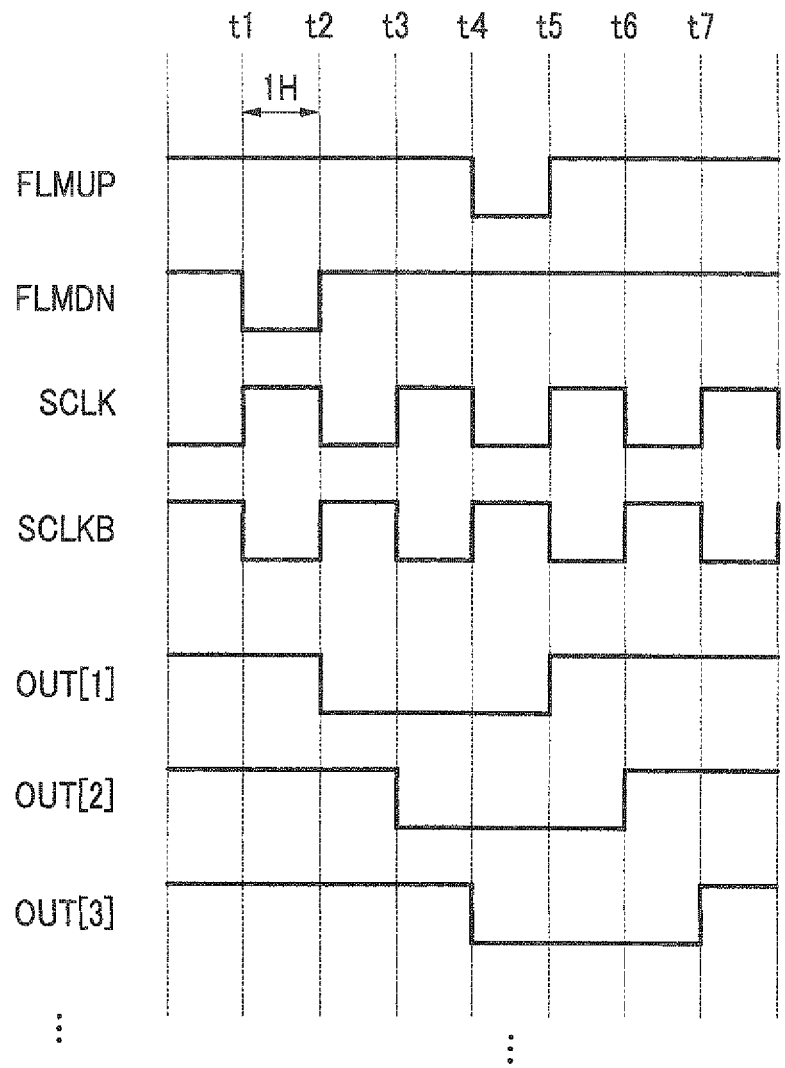
FIG. 13 is a timing diagram to explain a driving method of the scan driver of FIG. 10 according to another exemplary embodiment of the present invention.

FIG. 13 is a timing diagram to explain the driving method of the scan driver of FIG. 10 according to another exemplary embodiment of the present invention. The scan driver according to the fourth exemplary embodiment is capable of being used as the scan driver 400 of FIG. 1.

Referring to FIGS. 10, 11, and 13, the first frame start signal FLMUP has a voltage of logic low level applied thereto at the section t4-t5, and the second frame start signal FLMDN has a voltage of logic low level applied thereto at the section t1-t2.

In the section t1-t2, the first sequential input terminal INUP of the first scan driving block 410_1 is inputted with the first frame start signal FLMUP of logic high level, the second sequential input terminal INDN is inputted with the second frame start signal FLMDN of logic low level, the first clock signal input terminal CLK is inputted with the first clock signal SCLK of logic high level, and the second clock signal input terminal CLKB is inputted with the second clock signal SCLKB of logic low level.

For the first input block 411 of the first scan driving block 410_1 in the section t1-t2, the third transistor M03 and the fourth transistor M04 are turned off.

For the second input block 412 of the first scan driving block 410_1 in the section t1-t2, the third transistor M08 and the fourth transistor M09 are turned on, the VGH power source voltage is transmitted to the second node N04 through the turned-on third transistor M08, and the second frame start signal FLMDN of logic low level is transmitted to the first node N03 through the turned-on fourth transistor M09. The second transistor M07 is turned on by the voltage of logic low level of the first node N03, and the first clock signal SCLK of logic high level is transmitted to the second sequential output terminal DN through the turned-on second transistor M07. Here, one terminal of the second capacitor C05 has a voltage of logic low level applied thereto and the other terminal has a voltage of logic high level applied thereto, so as to be charged.

In the section t2-t3, the first sequential input terminal INUP of the first scan driving block 410_1 is inputted with the first frame start signal FLMUP of logic high level, the second sequential input terminal INDN is inputted with the second frame start signal FLMDN of logic high level, the first clock signal input terminal CLK is inputted with the first clock signal SCLK of logic low level, and the second clock signal input terminal CLKB is inputted with the second clock signal SCLKB of logic high level.

For the second input block 412 of the first scan driving block 410_1 in the section t2-t3, the third transistor M08 and the fourth transistor M09 are turned off. The second transistor M07 is turned on by the voltage of logic low level formed at the first node N03 by the voltage charged in the second capacitor C05. The first clock signal SCLK of logic low level is transmitted to the second sequential output terminal DN through the turned-on second transistor M07.

For the output block 413 of the first scan driving block 410_1 in the section t2-t3, the voltage of logic low level transmitted to the second sequential output terminal DN turns on the third transistor M13, and the VGL power source voltage is transmitted to the first node N11 through the turned-on third transistor M13. The voltage of logic low level of the first node N11 turns on the sixth transistor M16, and the VGL power source voltage is transmitted to the signal output terminal OUT through the turned-on sixth transistor M16, and is outputted. That is, the first scan driving block 410_1 outputs the output signal OUT of logic low level in the section t2-t3.

On the other hand, the second sequential input terminal INDN of the second scan driving block 410_2 has a voltage of logic low level, outputted from the second sequential output terminal DN of the first scan driving block 410_1, applied thereto in the section t2-t3, the first clock signal input terminal CLK has a second clock signal SCLKB of logic high level applied thereto, and the second clock signal input terminal CLKB has a first clock signal SCLK of logic low level applied thereto. Accordingly, the second scan driving block 410_2 in the section t2-t3 receives a signal having the same waveform as a signal inputted to the first scan driving block 410_1 in the section t1-t2, and is equally operated.

Also, the second scan driving block 410_2 in the section t3-t4 receives a signal having the same waveform as a signal inputted to the first scan driving block 410_1 in the section t2-t3, and is equally operated That is, the second scan driving block 410_2 is delayed by one horizontal cycle for the first scan driving block 410_1, and is operated. The k scan driving block is delayed by one horizontal cycle for the k−1 scan driving block so as to be operated. The second scan driving block 410_2 outputs an output signal of logic low level to the second sequential output terminal DN in the section t3-t4.

In the section t3-t4, the first sequential input terminal INUP of the first scan driving block 410_1 is inputted with the first frame start signal FLMUP of logic high level, the second sequential input terminal INDN is inputted with the second frame start signal FLMDN of logic high level, the first clock signal input terminal CLK is inputted with the first clock signal SCLK of logic high level, the second clock signal input terminal CLKB is inputted with the second clock signal SCLKB of logic low level.

For the second input block 412 of the first scan driving block 410_1 in the section t3-t4, the third transistor M08 is turned off and the fourth transistor M09 is turned on. The second frame start signal FLMDN of logic high level is transmitted to the first node N03 through the turned-on fourth transistor M09 so that the second transistor M07 is turned off. Accordingly, the first clock signal SCLK of logic high level is not transmitted to the second sequential output terminal DN. Here, the signal of logic low level outputted from the second sequential output terminal DN of the second scan driving block 410_2 is transmitted to the second inverse-output input terminal DNB. The fifth transistor M10 is turned on, and the VGL power source voltage is transmitted to the second node N04 through the turned-on fifth transistor M10 so that the first transistor M06 is turned on. The VGH power source voltage is transmitted to the second sequential output terminal DN through the turned-on first transistor M06.

In the section t3-t4, the third transistor M13 of the output block 413 of the first scan driving block 410_1 is turned off. Here, the voltage of logic low level of the first node N11, formed by the voltage charged to the second capacitor C12, turns on the sixth transistor M16, and the VGL power source voltage is transmitted to the signal output terminal OUT through the turned-on sixth transistor M16. That is, the first scan driving block 410_1 outputs the output signal OUT of logic low level in the section t3-t4.

In the section t4-t5, the first sequential input terminal INUP of the first scan driving block 410_1 is inputted with the first frame start signal FLMUP of logic low level, the second sequential input terminal INDN is inputted with the second frame start signal FLMDN of logic high level, the first clock signal input terminal CLK is inputted with the first clock signal SCLK of logic low level, and the second clock signal input terminal CLKB is inputted with the second clock signal SCLKB of logic high level.

For the first input block 411 of the first scan driving block 410_1 in the section t4-t5, the third transistor M03 and the fourth transistor M04 are turned on, the VGH power source voltage is transmitted to the second node N02 through the turned-on third transistor M03, and the first frame start signal FLMUP of logic low level is transmitted to the first node N01 through the turned-on fourth transistor M04. The second transistor M02 is turned on by the voltage of logic low level of the first node N01, and the second clock signal SCLKB of logic high level is transmitted to the first sequential output terminal UP through the turned-on second transistor M02. Here, one terminal of the second capacitor C02 has a voltage of logic low level applied thereto, and the other terminal has a voltage of logic high level applied thereto so as to be charged. The voltage of logic high level transmitted to the first sequential output terminal UP turns off the first transistor M11 and the second transistor M12 of the output block 413.

The second input block 412 of the first scan driving block 410_1 in the section t4-t5 transmits the first clock signal SCLK of logic low level to the second sequential output terminal DN as in the section t2-t3. The output block 413 transmits the VGL power source voltage to the output terminal OUT, as in the section t2-t3, so as to be outputted. That is, the first scan driving block 410_1 outputs the output signal OUT of logic low level in the section t4-t5.

In the section t5-t6, the first sequential input terminal INUP of the first scan driving block 410_1 is inputted with the first frame start signal FLMUP of logic high level, the second sequential input terminal INDN is inputted with the second frame start signal FLMDN of logic high level, the first clock signal input terminal CLK is inputted with the first clock signal SCLK of logic high level, and the second clock signal input terminal CLKB is inputted with the second clock signal SCLKB of logic low level.

In the section t5-t6, for the first input block 411 of the first scan driving block 410_1, the third transistor M03 and the fourth transistor M04 are turned off, and the second transistor M02 is turned on by the voltage formed at the first node N01 by the voltage charged to the second capacitor C02. The second clock signal SCLKB of logic low level is transmitted to the first sequential output terminal UP through the turned-on second transistor M02.

In the section t5-t6, for the second input block 412 of the first scan driving block 410_1, the third transistor M08 is turned off and the fourth transistor M09 is turned on, and a voltage of logic high level is transmitted, at the first node N03, through the turned-on fourth transistor M09, such that the second transistor M07 is turned off. Here, the second scan driving block 410_2 in the section t5-t6 outputs the voltage of logic low level to the second sequential output terminal DN as in the first scan driving block 410_1 of the section t4-t5, and the voltage of logic low level outputted from the second sequential output terminal DN of the second scan driving block 410_2 is applied to the second inverse-output input terminal DNB of the first scan driving block 410_1. The fifth transistor M10 is turned on, and VGL power source voltage is transmitted to the second node N04 through the turned-on fifth transistor M10. The voltage of logic low level the second node N04 turns on the first transistor M06 and the VGH power source voltage is transmitted to the second sequential output terminal DN through the turned-on first transistor M06.

In the section t5-t6, for the output block 413 of the first scan driving block 410_1, the voltage of logic low level of the first sequential output terminal UP turns on the first transistor M11 and the second transistor M12, and the voltage of logic high level of the second sequential output terminal DN turns off the third transistor M13. The VGH power source voltage is transmitted to the first node N11 through the turned-on first transistor M11, and the VGL power source voltage is transmitted to the second node N12 through the turned-on second transistor M12. The voltage of logic high level of the first node N11 turns off the sixth transistor M16. The voltage of logic low level of the second node N12 turns on the fifth transistor M15, and the VGH power source voltage is transmitted to the signal output terminal OUT through the turned-on fifth transistor M15 so as to be outputted. That is, the first scan driving block 410_1 outputs the output signal OUT of logic high level in the section t5-t6.

As described above, the first scan driving block 410_1 outputs the output signal OUT of logic low level during the section t2-t5, and outputs the output signal OUT of logic high level from the time t5. The second scan driving block 410_2 outputs the output signal OUT of logic low level during the section t3-t6 which is delayed by one horizontal cycle for the output signal OUT of the first scan driving block 410_1, and the output signal OUT of logic high level from the time t6. The third scan driving block 410_3 outputs the output signal OUT of logic low level during the section t4-t7 which is delayed by one horizontal cycle for the output signal OUT of the second scan driving block 410_2, and the output signal OUT of logic high level from the time t7. Through this method, the plurality of scan driving blocks 410_1, 410_2, 410_3, . . . sequentially output the output signals OUT[1], OUT[2], OUT[3], . . . to the n-th scan driving block.

When the plurality of scan driving blocks 410_1, 410_2, 410_3, . . . are used as the scan driver 200 of FIG. 1, the section where the output signal of logic low level is outputted is the scan section where the data is written to the pixel, and then the section where the output signal of logic high level is outputted is the sustain section where the pixel emits the light.

When the interval that the first frame start signal FLMUP and the second frame start signal FLMDN of logic low level is applied is referred to as N, the pulse width PW of the output signals OUT[1], OUT[2], OUT[3], . . . outputted from the plurality of scan driving blocks 410_1, 410_2, 410_3, . . . is 2N+1H (N=0, 1, 2, . . . ). That is, the interval wherein the first frame start signal FLMUP and the second frame start signal FLMDN of logic low level are controlled so that the pulse width of the output signals OUT[1], OUT[2], OUT[3], . . . of logic low level output from the plurality of scan driving blocks 410_1, 410_2, 410_3, . . . may be adjusted.

Figure 14:
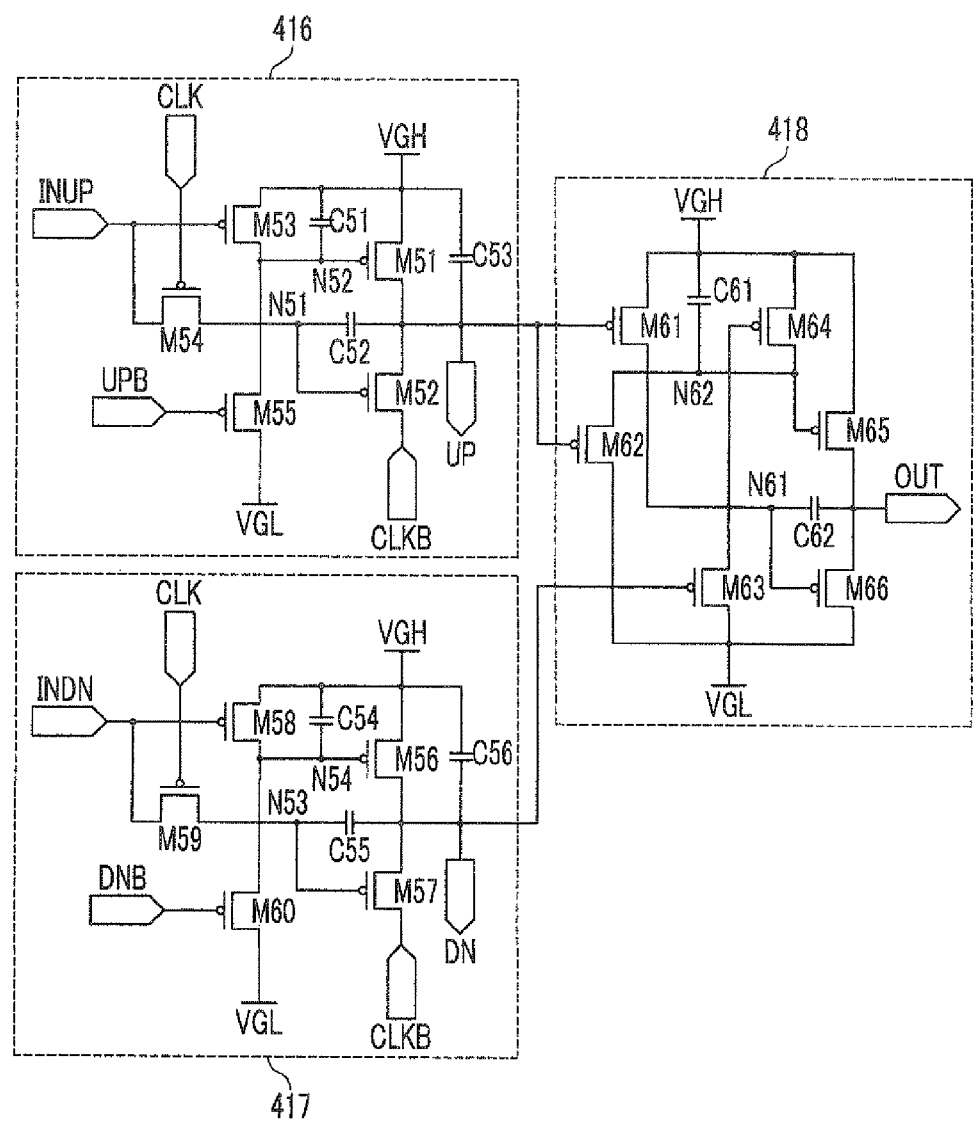
FIG. 14 is a circuit diagram of another example of a scan driving block included in the scan driver of FIG. 10.

FIG. 14 is a circuit diagram showing another example of the scan driving block included in the scan driver of FIG. 10.

Referring to FIG. 14, as compared to the scan driving block of FIG. 11, the first clock signal input terminal CLK and the second clock signal input terminal CLKB are connected to different positions in the second input block 417 of FIG. 14 as compared to the second input block 412 of FIG. 11.

The scan driving block of FIG. 14 is not the same as the scan driving block of FIG. 11 in that, in FIG. 14, the first clock signal input terminal CLK and the second clock signal input terminal CLKB are connected to the same position in a first input block 416 and a second input block 417. That is, in each of the first input block 416 and the second input block 417, the first clock signal input terminal CLK is connected to the gate electrode of the fourth transistors M54 and M59, and the second clock signal input terminal CLKB is connected to one terminal of the second transistors M52 and M57. The other configurations are the same as those of the scan driving block of FIG. 11 such that the description thereof is omitted.

Figure 15:
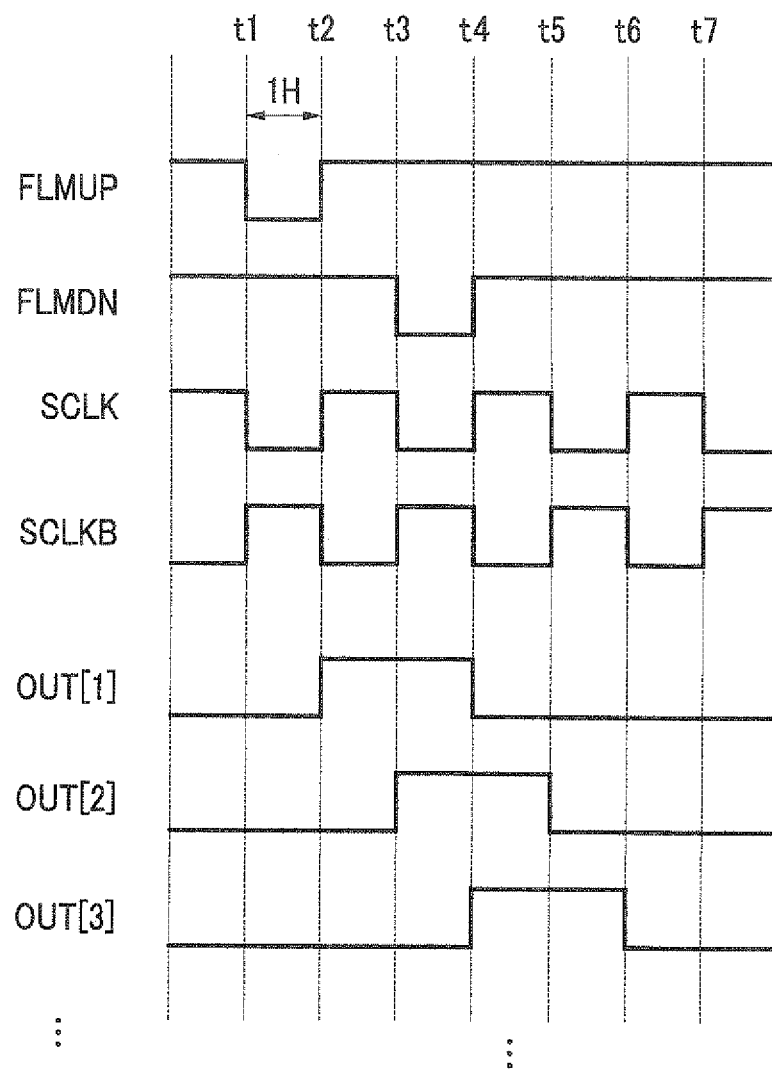
FIG. 15 is a timing diagram to explain a driving method of the scan driver of FIG. 10 according to another exemplary embodiment of the present invention.

FIG. 15 is a timing diagram to explain the driving method of the scan driver of FIG. 10 according to another exemplary embodiment of the invention. The scan driver according to the fourth exemplary embodiment may use the light emission driver 400 of FIG. 1, and is a case using the scan driving block of FIG. 14.

Referring to FIGS. 10, 14, and 15, the differences as compared with FIG. 12 will be described.

The first frame start signal FLMUP has a voltage of logic low level applied thereto at the section t1-t2, and the second frame start signal FLMDN has a voltage of logic low level applied thereto at the section t3-t4.

For the first input block 416 of the first scan driving block 410_1 in the section t1-t2, the second clock signal SCLKB of logic high level is transmitted to the first sequential output terminal UP, the voltage of logic low level is applied to one terminal of the second capacitor C52, and the voltage of logic high level is applied to another terminal to be charged.

For the second input block 417 of the first scan driving block 410_1 in the section t1-t2, the fourth transistor M59 is turned on by the first clock signal SCLK of logic low level, and the second frame start signal FLMDN of logic high level is transmitted to the gate electrode of the second transistor M57 through the turned-on fourth transistor M59.

For the output block 418 of the first scan driving block 410_1 in the section t1-t2, the first transistor M61 and the second transistor M62 are turned off by the voltage of logic high level transmitted to the first sequential output terminal UP.

In the section t2-t3, in the first input block 416 of the first scan driving block 410_1, the second transistor M52 is turned on by the voltage of logic low level formed at the first node N51 by the voltage charged to the second capacitor C52, and the second clock signal SCLKB of logic low level is transmitted to the first sequential output terminal UP through the turned-on second transistor M52.

For the output block 418 of the first scan driving block 410_1 in the section t2-t3, the first transistor M61 and the second transistor M62 are turned on by the voltage of logic low level transmitted to the first sequential output terminal UP. The VGH power source voltage is transmitted to the first node N61 through the turned-on first transistor M61, and the VGL power source voltage is transmitted to the second node N62 through the turned-on second transistor M62. The sixth transistor M66 is turned off and the fifth transistor M65 is turned on. The VGH power source voltage is transmitted to the signal output terminal OUT through the turned-on fifth transistor M65 so as to be outputted.

In the section t3-t4, the first sequential input terminal INUP of the first scan driving block 410_1 is inputted with the first frame start signal FLMUP of logic high level, and the second sequential input terminal INDN is inputted with the second frame start signal FLMDN of logic low level.

For the first input block 416 of the first scan driving block 410_1 in the section t3-t4, the third transistor M53 is turned off and the fourth transistor M54 is turned on. The first frame start signal FLMUP of logic high level is transmitted to the first node N51 through the turned-on fourth transistor M54 such that the second transistor M52 is turned off. Here, the signal of logic low level outputted from the first sequential output terminal UP of the second scan driving block 410_2 is transmitted to the first inverse-output input terminal UPB such that the fifth transistor M55 is turned on. The VGL power source voltage is transmitted to the second node N52 through the turned-on fifth transistor M55 so that the first transistor M51 is turned on. The VGH power source voltage is transmitted to the first sequential output terminal UP through the turned-on first transistor M51.

For the second input block 417 of the first scan driving block 410_1 in the section t3-t4, the third transistor M58 and the fourth transistor M59 are turned on, the VGH power source voltage is transmitted to the second node N54, and the second frame start signal FLMDN of logic low level is transmitted to the first node N53. The second transistor M57 is turned on, and the second clock signal CLKB of logic high level is transmitted to the second sequential output terminal DN through the turned-on second transistor M57.

For the output block 417 of the first scan driving block 410_1 in the section t3-t4, the first transistor M61, the second transistor M62 and the third transistor M63 are turned off. Here, the voltage of logic low level of the second node N62, formed by the voltage charged to the first capacitor C61, turns on the fifth transistor M65, and the VGH power source voltage is transmitted to the signal output terminal OUT through the turned-on fifth transistor M65.

In the section t4-t5, for the second input block 417 of the first scan driving block 410_1, the third transistor M58 and the fourth transistor M59 are turned off, a voltage of logic low level is formed at the first node N53 by the voltage charged to the second capacitor C55, and the second transistor M57 is turned on. The second clock signal SCLKB of logic low level is transmitted to the second sequential output terminal DN through the turned-on second transistor M57.

In the section t4-t5, in the output block 418 of the first scan driving block 410_1, the third transistor M63 is turned on and the VGL power source voltage is transmitted to the first node N61. The sixth transistor M66 is turned on and the VGL power source voltage is transmitted to the signal output terminal OUT. That is, the first scan driving block 410_1 outputs the output signal OUT of logic low level in the section t4-t5.

Through this method, the second scan driving block 410_2 outputs the output signal OUT of logic high level during the section t3-t5 which is delayed by one horizontal cycle for the output signal OUT of the first scan driving block 410_1, and outputs the output signal OUT of logic low level from the time t5. The third scan driving block 410_3 outputs the output signal OUT of logic high level during the section t4-t6 which is delayed by one horizontal cycle for the output signal OUT of the second scan driving block 410_2, and outputs the output signal OUT of logic low level from the time t6, and thereby the output signals OUT[1], OUT[2], OUT[3], . . . are sequentially outputted to the n-th scan driving block.

When the plurality of scan driving blocks 410_1, 410_2, 410_3, . . . are used as the light emission driver 400 of FIG. 1, the section where the output signal of logic high level is outputted is the scan section where the data is written to the pixel, and then the section where the output signal of logic low level is outputted in the sustain section where the pixel emits the light.

When the first clock signal input terminal CLK and the second clock signal input terminal CLKB are connected to the same position in the first input block 416 and the second input block 417 of the scan driving block, the pulse width PW of the output signals OUT[1], OUT[2], OUT[3], . . . output from the plurality of scan driving blocks 410_1, 410_2, 410_3, . . . is 2NH (N=1, 2, . . . ). Here, N is the interval in which the first frame start signal FLMUP and the second frame start signal FLMDN of logic low level are applied. The interval in which the first frame start signal FLMUP and the second frame start signal FLMDN of logic low level are applied such that the pulse width PW of the output signals OUT[1], OUT[2], OUT[3], . . . of logic high level outputted from the plurality of scan driving blocks 410_1, 410_2, 410_3, . . . may be adjusted, thereby the duty of the section from which the output signal of logic low level is outputted may be adjusted.

Figure 16:
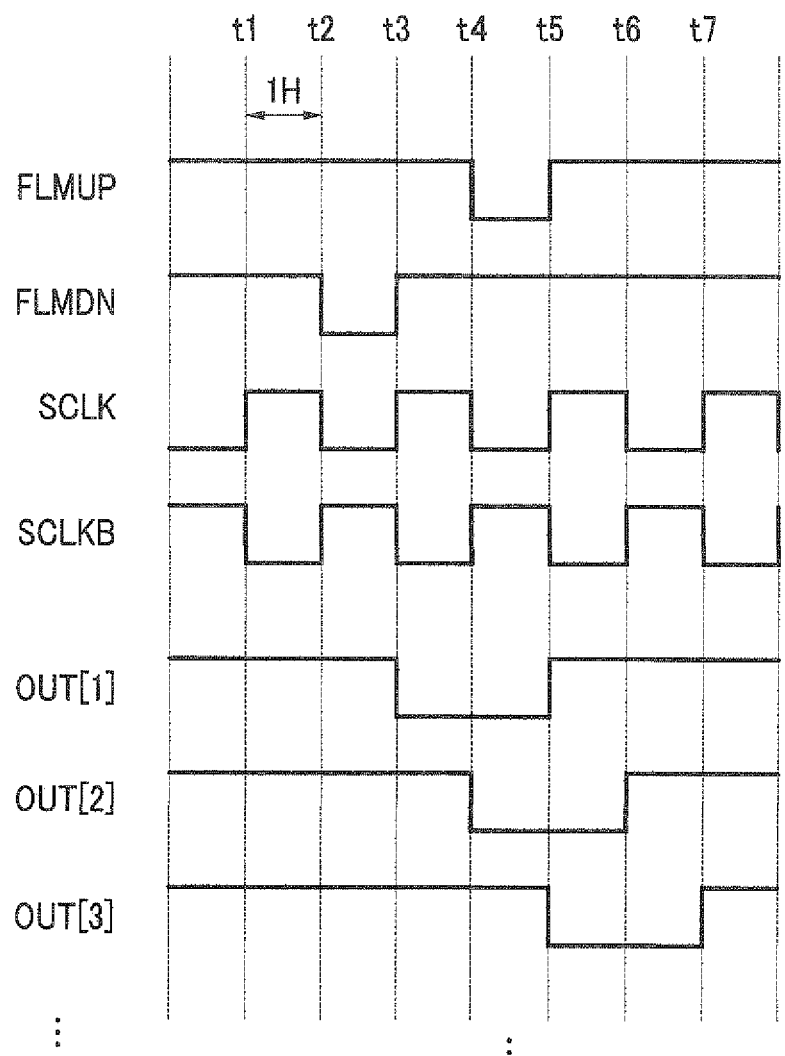
FIG. 16 is a timing diagram to explain a driving method of the scan driver of FIG. 10 according to another exemplary embodiment of the present invention.

FIG. 16 is a timing diagram of the driving method of the scan driver of FIG. 10 according to another exemplary embodiment of the invention. The scan driver according to the fourth exemplary embodiment may be used as the scan driver 200 of FIG. 1 and is the case using the scan driving block of FIG. 14.

Referring to FIGS. 10, 14 and 16, the differences compared to FIG. 13 will be described.

The first frame start signal FLMUP has a voltage of logic low level applied thereto at the section t4-t5, and the second frame start signal FLMDN has the voltage of logic low level applied thereto at the section t2-t3.

In the section t2-t3, for the first input block 416 of the first scan driving block 410_1, the third transistor M53 is turned off and the fourth transistor M54 is turned on, and the first frame start signal of logic high level is transmitted to the first node N51 such that the second transistor M52 is turned off.

For the second input block 417 of the first scan driving block 410_1 in the section t2-t3, the third transistor M58 and the fourth transistor M59 are turned on. The second transistor M57 is turned on, and the second clock signal SCLKB of a logic high level is transmitted to the second sequential output terminal DN. Here, one terminal of the second capacitor C55 has a voltage of logic low level applied thereto and the other terminal has a voltage of the logic high level to be charged.

In the section t3-t4, the second input block 417 of the first scan driving block 410_1, the third transistor M58 and the fourth transistor M59 are turned off. The second transistor M57 is turned on by the voltage of logic low level formed at the first node N53 by the voltage charged to the second capacitor C55. The second clock signal SCLKB of logic low level is transmitted to the second sequential output terminal DN through the turned-on second transistor M57.

For the output block 418 of the first scan driving block 410_1 in the section t3-t4, the third transistor M63 is turned on, and the VGL power source voltage is transmitted to the first node N61 through the turned-on third transistor M63. The voltage of logic low level the first node N61 turns-on the sixth transistor M66, and the VGL power source voltage is transmitted to the signal output terminal OUT through the turned-on sixth transistor M66 so as to be outputted. That is, the first scan driving block 410_1 outputs the output signal OUT of logic low level in the section t3-t4.

In the section t4-t5, the first sequential input terminal INUP of the first scan driving block 410_1 is inputted with the first frame start signal FLMUP of logic low level, and the second sequential input terminal INDN is inputted with the second frame start signal FLMDN of logic high level.

for the first input block 416 of the first scan driving block 410_1 in the section t4-t5, the third transistor M53 and the fourth transistor M54 are turned on. The voltage of logic low level is formed at the first node N51, and the second transistor M52 is turned-on such that the second clock signal SCLKB of logic high level is transmitted to the first sequential output terminal UP.

For the second input block 417 of the first scan driving block 410_1 in the section t4-t5, the third transistor M58 is turned off and the fourth transistor M59 is turned on. The second frame start signal FLMDN of logic high level is transmitted to the first node N53 through the turned-on fourth transistor M59 such that the second transistor M57 is turned off. Here, the signal of logic low level output from the second sequential output terminal DN of the second scan driving block 410_2 is transmitted to the second inverse-output input terminal DNB such that the fifth transistor M60 is turned on. The VGL power source voltage is transmitted to the second node N54 through the turned-on fifth transistor M60 such that the first transistor M56 is turned on. The VGH power source voltage is transmitted to the second sequential output terminal DN through the turned-on first transistor M56.

For the output block 418 of the first scan driving block 410_1 in the section t4-t5, the first transistor M61, the second transistor M62 and the third transistor M63 are turned off. Here, the sixth transistor M66 is turned on by the voltage of logic low level of the first node N61 formed by the voltage charged to the second capacitor C62, and the VGL power source voltage is transmitted to the signal output terminal OUT through the turned-on sixth transistor M66.

In the section t5-t6, for the first input block 416 of the first scan driving block 410_1, the third transistor M53 and the fourth transistor M54 are turned off. Here, the voltage of logic low level is formed at the first node N51 by the voltage charged to the second capacitor C52, and the second transistor M52 is turned on such that the second clock signal SCLKB of logic low level is transmitted to the first sequential output terminal UP.

In the section t5-t6, for the output block 418 of the first scan driving block 410_1, the first transistor M61 and the second transistor M62 are turned on. The VGH power source voltage is transmitted to the first node N61, and the VGL power source voltage is transmitted to the second node N62. The fifth transistor M65 is turned on and the VGH power source voltage is transmitted to the signal output terminal OUT. That is, the first scan driving block 410_1 outputs the output signal OUT of logic high level in the section t5-t6.

As described above, the first scan driving block 410_1 outputs the output signal OUT of logic low level during the section t3-t5 and the output signal OUT of logic high level from the time t5. The second scan driving block 410_2 outputs the output signal OUT of logic low level during the section t4-t6 which is delayed by one horizontal cycle for the output signal OUT of the first scan driving block 410_1, and outputs the output signal OUT of logic high level from the time t6. The third scan driving block 410_3 outputs the output signal OUT of logic low level during the section t5-t7 which is delayed by one horizontal cycle for the output signal OUT of the second scan driving block 410_2, and outputs the output signal OUT of logic high level from the time t7. Through this method, the plurality of scan driving blocks 410_1, 410_2, 410_3, . . . sequentially output the output signals OUT[1], OUT[2], OUT[3], . . . to the n-th scan driving block.

When the plurality of scan driving blocks 410_1, 410_2, 410_3, . . . are used as the scan driver 200 of FIG. 1, the section where the output signal of logic low level is outputted is the scan section where the data is written to the pixel, and then the section where the output signal of logic high level is outputted is the sustain section where the pixel emits the light.

When the first clock signal input terminal CLK and the second clock signal input terminal CLKB are connected to the same position in the second input block 417 and the first input block 416 of the scan driving block, the pulse width PW of the signals OUT[1], OUT[2], OUT[3], . . . outputted from the plurality of scan driving blocks 410_1, 410_2, 410_3, . . . is 2NH (N=1, 2, . . . ). Here, N is the interval in which the first frame start signal FLMUP and the second frame start signal FLMDN of logic low level are applied. By adjusting the interval in which the first frame start signal FLMUP and the second frame start signal FLMDN of logic low level are applied, the pulse width of the signals OUT[1], OUT[2], OUT[3], . . . outputted from the plurality of scan driving blocks 410_1, 410_2, 410_3, . . . may be adjusted.

Figure 17:
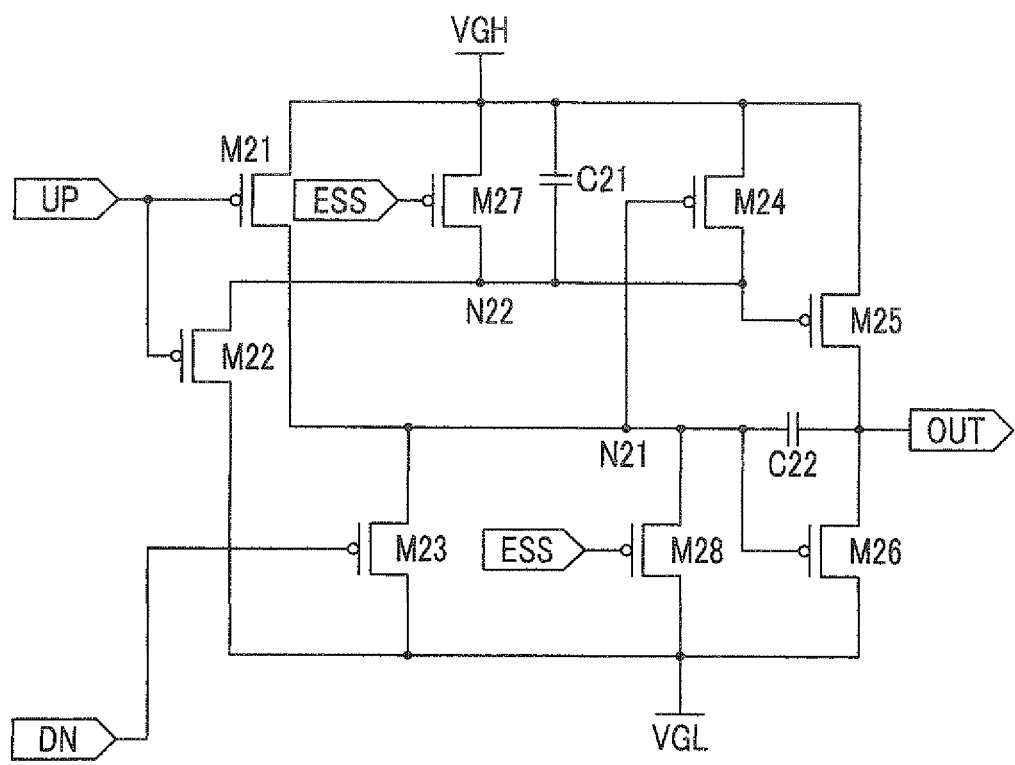
FIG. 17 is a circuit diagram of another example of a scan driving block included in the scan driver of FIG. 10.

FIG. 17 is a circuit diagram showing another example of the scan driving block included in the scan driver of FIG. 10.

Referring to FIG. 17, output blocks 413 and 418, which are different from the scan driving blocks of FIG. 11 or FIG. 14, are provided. The first input blocks 411 and 416 and the second input blocks 412 and 417 have the same configuration as those of FIG. 11 or FIG. 14 such that the description thereof is omitted, and the output block 413 will be described.

The output blocks 413 and 418 include a plurality of transistors M21, M22, M23, M24, M25, M26, M27 and M28 and a plurality of capacitors C21 and C22. The output blocks 413 and 418 receive the input signals from the first sequential output terminal UP, the second sequential output terminal DN, and the typical signal input terminal ESS.

The first transistor M21 includes a gate electrode connected to the first sequential output terminal UP, one terminal connected to the VGH power source, and another terminal connected to the first node N21. The second transistor M22 includes a gate electrode connected to the first sequential output terminal UP, one terminal connected to the VGL power source, and another terminal connected to the second node N22. The third transistor M23 includes a gate electrode connected to the second sequential output terminal DN, one terminal connected to the VGL power source, and another terminal connected to the first node N21. The fourth transistor M24 includes a gate electrode connected to the first node N21, one terminal connected to the VGH power source, and another terminal connected to the second node N22. The fifth transistor M25 includes a gate electrode connected to the second node N22, one terminal connected to the VGH power source, and another terminal connected to signal output terminal OUT. The sixth transistor M26 includes a gate electrode connected to the first node N21, one terminal connected to the VGL power source, and another terminal connected to the signal output terminal OUT. The seventh transistor M27 includes a gate electrode connected to the typical signal input terminal ESS, one terminal connected to the VGH power source, and another terminal connected to the second node N22. The eighth transistor M28 includes a gate electrode connected to typical signal input terminal ESS, one terminal connected to the VGL power source, and another terminal connected to the first node N21.

The first capacitor C21 includes one terminal connected to the VGH power source and another terminal connected to the second node N22. The second capacitor C22 includes one terminal connected to the first node N21 and another terminal connected to the signal output terminal OUT.

The first node N21 is connected to the other terminal of the first transistor M21, the other terminal of the third transistor M23, the gate electrode of the sixth transistor M26, the other terminal of the eighth transistor M28, and one terminal of the second capacitor C22. The second node N22 is connected to the other terminal of the second transistor M22, the other terminal of the fourth transistor M24, the gate electrode of the fifth transistor M25, the other terminal of the seventh transistor M27, and the other terminal of the first capacitor C21.

The output blocks 413 and 418 are equally operated as described above in FIG. 12 and FIG. 13 during the time when the gate-on voltage turning on the seventh transistor M27 and the eighth transistor M28 is not applied to the typical signal input terminal ESS. The gate electrodes of the seventh transistor M27 and the eighth transistor M28 may be connected to an additional wire applied with the typical signal. The seventh transistor M27 and the eighth transistor M27 are p-channel field effect transistors. Also, the seventh transistor M27 and the eighth transistor M28 may be n-channel field effect transistors.

If the typical signal input terminal ESS has a gate-on voltage applied thereto so as to turn on the seventh transistor M27 and the eighth transistor M28, the VGH power source voltage is transmitted to the second node N22 through the turned-on seventh transistor M27, and the VGL power source voltage is transmitted to the first node N21 through the turned-on eighth transistor M28. The voltage of the logic low level of the first node N21 turns on the sixth transistor M26, and the VGL power source voltage is transmitted to the signal output terminal OUT through the turned-on sixth transistor M26 so as to be outputted. That is, the scan driving block outputs the output signal of the logic low level regardless of the signal transmitted in the first sequential output terminal UP and the second sequential output terminal DN.

The typical signal of the gate-on voltage is simultaneously transmitted to the plurality of scan driving blocks 410_1, 410_2, 410_3, . . . , and accordingly the plurality of scan driving blocks 410_1, 410_2, 410_3, . . . may simultaneously output the output signal of logic low level.

When the plurality of scan driving blocks 410_1, 410_2, 410_3, . . . are used as the light emission driver 400, the scan driver simultaneously outputs the output signal of logic low level by using the typical signal for the simultaneous light emitting of the plurality of pixels.

Figure 18:
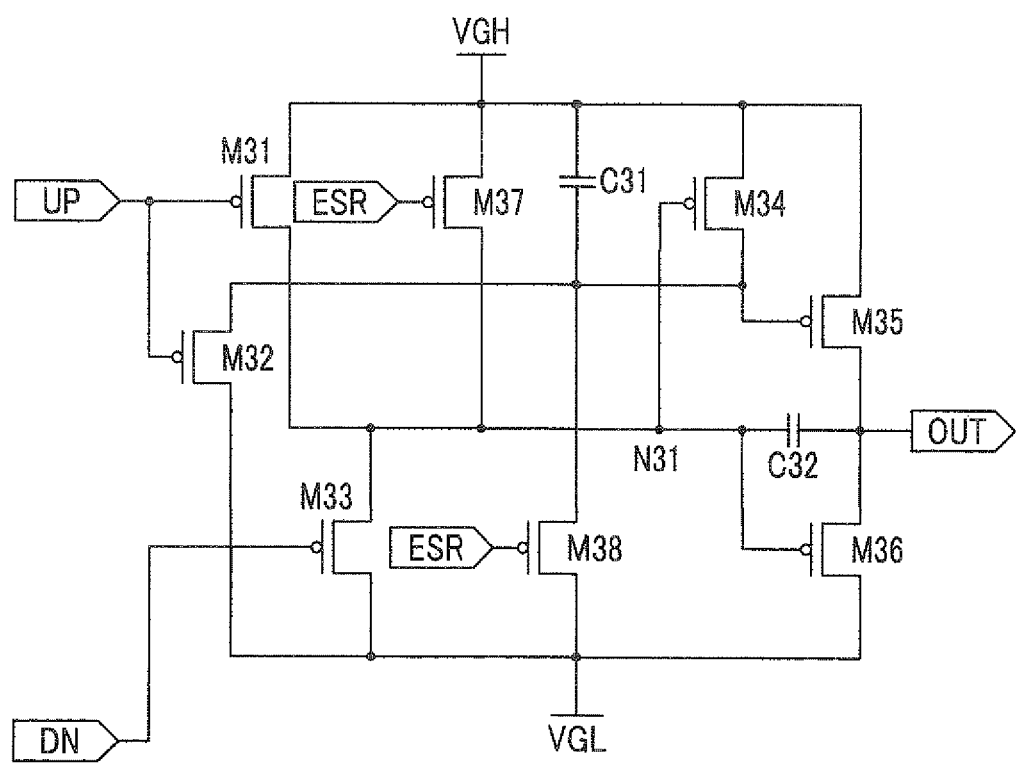
FIG. 18 is a circuit diagram of another example of a scan driving block included in the scan driver of FIG. 10.

FIG. 18 is a circuit diagram of another example of the scan driving block included in the scan driver of FIG. 10.

Referring to FIG. 18, a different example of the output blocks 413 and 418 from the scan driving block of FIG. 11 or FIG. 14 is provided. The first input blocks 411 and 416 and the second input blocks 412 and 417 have the same configuration as in FIG. 11 or FIG. 14 such that the description thereof is omitted, and the output blocks 413 and 418 will be described.

The output blocks 413 and 418 include a plurality of transistors M31, M32, M33, M34, M35, M36, M37, and M38 and a plurality of capacitors C31 and C32. The output blocks 413 and 418 receive the input signals from the first sequential output terminal UP, the second sequential output terminal DN, and the typical signal input terminal ESR.

The first transistor M31 includes a gate electrode connected to the first sequential output terminal UP, one terminal connected to the VGH power source, and another terminal connected to the first node N31. The second transistor M32 includes a gate electrode connected to the first sequential output terminal UP, one terminal connected to the VGL power source, and another terminal connected to the second node N32. The third transistor M33 includes a gate electrode connected to the second sequential output terminal DN, one terminal connected to the VGL power source, and another terminal connected to the first node N31. The fourth transistor M34 includes a gate electrode connected to the first node N31, one terminal connected to the VGH power source, and another terminal connected to the second node N32. The fifth transistor M35 includes a gate electrode connected to the second node N32, one terminal connected to the VGH power source, and another terminal connected to signal output terminal OUT. The sixth transistor M36 includes a gate electrode connected to the first node N31, one terminal connected to VGL power source, and another terminal connected to signal output terminal OUT. The seventh transistor M37 includes a gate electrode connected to the typical signal input terminal ESR, one terminal connected to the VGH power source, and another terminal connected to the first node N31. The eighth transistor M38 includes a gate electrode connected to the typical signal input terminal ESR, one terminal connected to the VGL power source, and another terminal connected to the second node N32.

The first capacitor C31 includes one terminal connected to the VGH power source and another terminal connected to the second node N32. The second capacitor C32 includes one terminal connected to the first node N31 and another terminal connected to the signal output terminal OUT.

The first node N31 is connected to the other terminal of the first transistor M31, the other terminal of the third transistor M33, the gate electrode of the sixth transistor M36, the other terminal of the seventh transistor M37, and one terminal of the second capacitor C32. The second node N32 is connected to the other terminal of the second transistor M32, the other terminal of the fourth transistor M34, the gate electrode of the fifth transistor M35, the other terminal of the eighth transistor M38, and the other terminal of the first capacitor C31.

The output blocks 413 and 418 are equally operated as described above in FIG. 12 and FIG. 13 during the time when the gate-on voltage turning on the seventh transistor M37 and the eighth transistor M38 is not applied to the typical signal input terminal ESR.

If the typical signal input terminal ESR has a gate-on voltage applied thereto so as to turn on the seventh transistor M37 and the eighth transistor M38, the VGH power source voltage is transmitted to the first node N31 through the turned-on seventh transistor M37, and the VGL power source voltage is transmitted to the second node N32 through the turned-on eighth transistor M38. The voltage of logic low level of the second node N32 turns on the fifth transistor M35, and the VGH power source voltage is transmitted to the signal output terminal OUT through the turned-on fifth transistor M35 so as to be outputted. That is, the scan driving block outputs the output signal of logic high level regardless of the signals transmitted from the first sequential output terminal UP and the second sequential output terminal DN.

The typical signal of the gate-on voltage may be simultaneously transmitted to the plurality of scan driving blocks 410_1, 410_2, 410_3, . . . , and accordingly the plurality of scan driving blocks 410_1, 410_2, 410_3, . . . may simultaneously output the output signal of logic high level.

When the plurality of scan driving blocks 410_1, 410_2, 410_3, . . . are used as the light emission driver 400, the scan driver outputs the output signal of logic high level by using the typical signal in all scan driving blocks such that the light emitting of all pixels may be suppressed.

Figure 19:
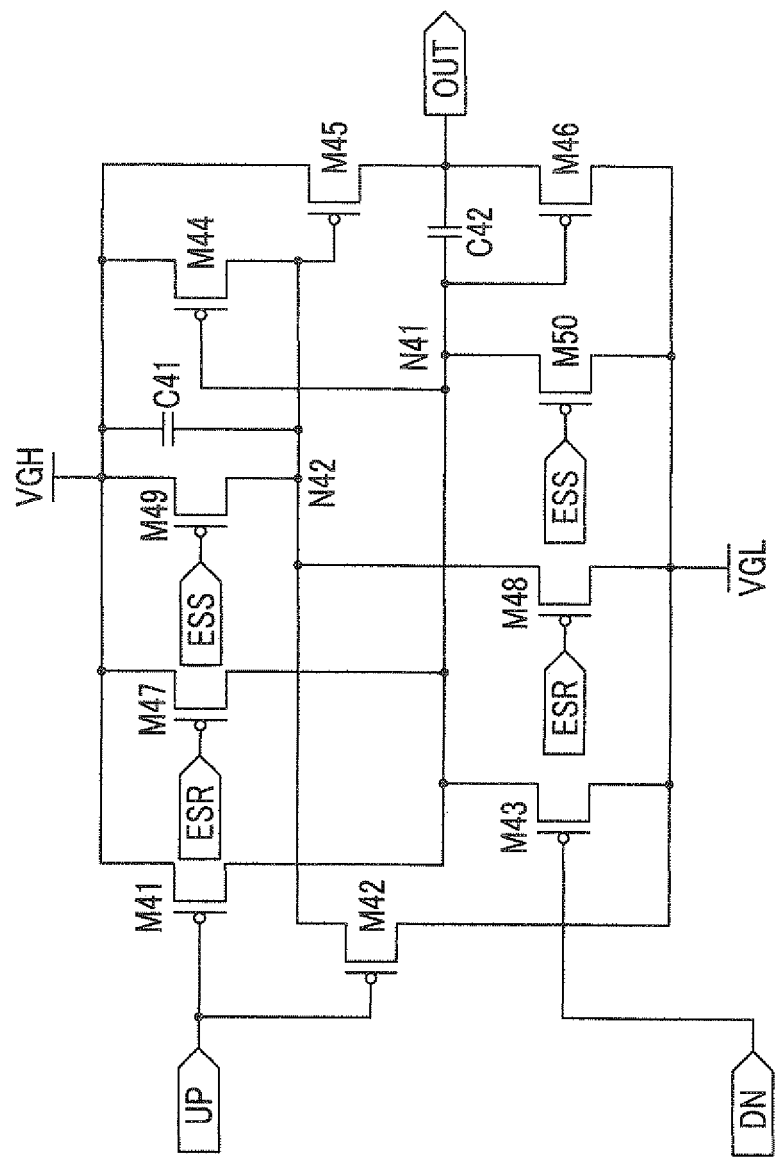
FIG. 19 is a circuit diagram of another example of a scan driving block included in the scan driver of FIG. 10.

FIG. 19 is a circuit diagram of another example of the scan driving block included in the scan driver of FIG. 10.

Referring to FIG. 19, the output blocks 413 and 418, which are configured differently from the scan driving block of FIG. 11 or FIG. 14, are provided. The first input blocks 411 and 416 and the second input blocks 412 and 417 are the same as those of FIG. 11 or FIG. 14 such that the description thereof is omitted, and the output blocks 413 and 418 will be described.

The output blocks 413 and 418 include a plurality of transistors M41, M42, M43, M44, M45, M46, M47, M48, M49 and M50 and a plurality of capacitors C41 and C42. The output blocks 413 and 418 receive the input signals from the first sequential output terminal UP, the second sequential output terminal DN, the first typical signal input terminal ESR, and the second typical signal input terminal ESS.

The first transistor M41 includes a gate electrode connected to the first sequential output terminal UP, one terminal connected to the VGH power source, and another terminal connected to the first node N41. The second transistor M42 includes a gate electrode connected to the first sequential output terminal UP, one terminal connected to the VGL power source, and another terminal connected to the second node N42. The third transistor M43 includes a gate electrode connected to the second sequential output terminal DN, one terminal connected to the VGL power source, and another terminal connected to the first node N41. The fourth transistor M44 includes a gate electrode connected to the first node N41, one terminal connected to the VGH power source, and another terminal connected to the second node N42. The fifth transistor M45 includes a gate electrode connected to the second node N42, one terminal connected to the VGH power source, and another terminal connected to signal output terminal OUT. The sixth transistor M46 includes a gate electrode connected to the first node N41, one terminal connected to the VGL power source, and another terminal connected to signal output terminal OUT. The seventh transistor M47 includes a gate electrode connected to the first typical signal input terminal ESR, one terminal connected to the VGH power source, and another terminal connected to the first node N41. The eighth transistor M48 includes a gate electrode connected to the first typical signal input terminal ESR, one terminal connected to the VGL power source, and another terminal connected to the second node N42. The ninth transistor M49 includes a gate electrode connected to the second typical signal input terminal ESS, one terminal connected to the VGH power source, and another terminal connected to the second node N42. The tenth transistor M50 includes a gate electrode connected to the second typical signal input terminal ESS, one terminal connected to the VGL power source, and another terminal connected to the first node N41.

The first capacitor C41 includes one terminal connected to the VGH power source and another terminal connected to the second node N42. The second capacitor C42 includes one terminal connected to the first node N41 and another terminal connected to signal output terminal OUT.

The first node N41 is connected to the other terminal of the first transistor M41, the other terminal of the third transistor M43, the gate electrode of the sixth transistor M46, the other terminal of the seventh transistor M47, the other terminal of the tenth transistor M50, and one terminal of the second capacitor C42. The second node N42 is connected to the other terminal of the second transistor M42, the other terminal of the fourth transistor M44, the gate electrode of the fifth transistor M45, the other terminal of the eighth transistor M481, the other terminal of the ninth transistor M49, and the other terminal of the first capacitor C41.

The output blocks 413 and 418 are equally operated as described above in FIG. 12 and FIG. 13 during the time when the gate-on voltage turning on the ninth transistor M49 and the tenth transistor M50 is applied to the second typical signal input terminal ESS, and the gate-on voltage turning on the seventh transistor M47 and the eighth transistor M48 is not applied to the first typical signal input terminal ESR.

If the second typical signal input terminal ESS has the first typical signal of the gate-on voltage turning on the ninth transistors M49 and the tenth transistor M50 applied thereto, the VGL power source voltage is transmitted to the first node N41 through the turned-on sixth transistor M46. The voltage of logic low level of the first node N41 turns on the sixth transistor M46, and the VGL power source voltage is transmitted to the signal output terminal OUT through the turned-on sixth transistor M46 so as to be outputted. That is, the scan driving block outputs the output signal of logic low level regardless of the signals transmitted from the first sequential output terminal UP and the second sequential output terminal DN.

If the first typical signal input terminal ESR has the second typical signal of the gate-on voltage turning on the seventh transistor M47 and the eighth transistor M48 applied thereto, the VGL power source voltage is transmitted to the second node N42 through the turned-on eighth transistor M48. The voltage of logic low level of the second node N42 turns on the fifth transistor M45, and the VGH power source voltage is transmitted to the signal output terminal OUT through the turned-on fifth transistor M45. That is, the scan driving block outputs the output signal of logic high level regardless of the signals transmitted from the first sequential output terminal UP and the second sequential output terminal DN.

The first typical signal or the second typical signal of the first gate-on voltage may be simultaneously transmitted to the plurality of scan driving blocks 410_1, 410_2, 410_3, . . . , and accordingly the plurality of scan driving blocks 410_1, 410_2, 410_3, . . . may simultaneously output the output signal of logic low level or logic high level.

The drawings and the detailed description described above are examples of the present invention, and are provided to explain the present invention. However, the scope of the present invention described in the claims is not limited thereto. Therefore, it will be appreciated by those skilled in the art that various modifications may be made and other equivalent embodiments are available. Accordingly, the actual scope of the present invention must be determined by the spirit of the appended claims.

What is claimed is:

1. A scan driver comprising a plurality of scan driving blocks, each scan driving block including a sequential input terminal, a first clock signal input terminal, a second clock signal input terminal, an inverse-output input terminal, and a signal output terminal;

the plurality of scan driving blocks comprises:
a first scan driving block receiving one of a frame start signal and an output signal of an adjacent scan driving block through the sequential input terminal of the first scan driving block, receiving a first clock signal through the first clock signal input terminal of the first scan driving block, and receiving a second clock signal having an inverse-phase voltage level of the first clock signal through the second clock signal input terminal of the first scan driving block so as to output a first output signal to the signal output terminal of the first scan driving block; and
a second scan driving block receiving the first output signal of the first scan driving block through the sequential input terminal of the second scan driving block, receiving the second clock signal through the first clock signal input terminal of the second scan driving block, and receiving the first clock signal through the second clock signal input terminal of the second scan driving block so as to output a second output signal to the signal output terminal of the second scan driving block,
the second output signal of the second scan driving block transmitted to the inverse-output input terminal of the first scan driving block;
each scan driving block including:
a first transistor transmitting a signal applied to the second clock signal input terminal to the signal output terminal of said each scan driving block;
a second transistor transmitting a power source voltage of a logic high level to the signal output terminal of said each scan driving block;
a third transistor transmitting a power source voltage of a logic low level for turning on the second transistor;
a fourth transistor transmitting the power source voltage of logic high level for turning off the second transistor; and
a fifth transistor transmitting a signal applied to the sequential input terminal of said each scan driving block to the gate electrode of the first transistor.

2. The scan driver of claim 1, wherein the first transistor includes:
a gate electrode to which the signal applied to the sequential input terminal is provided;

one terminal connected to the second clock signal input terminal; and another terminal connected to the signal output terminal.

3. The scan driver of claim 1, wherein the second transistor includes:
   a gate electrode to which one of the power source voltage of logic high level and the power source voltage of logic low level is provided;
   one terminal connected to the power source voltage of logic high level; and
   another terminal connected to the signal output terminal.

4. The scan driver of claim 1, wherein the third transistor includes:
   a gate electrode connected to the inverse-output input terminal;
   one terminal connected to the power source voltage of logic low level; and
   another terminal connected to a gate electrode of the second transistor.

5. The scan driver of claim 1, wherein the fourth transistor includes:
   a gate electrode connected to the sequential input terminal;
   one terminal connected to the power source voltage of logic high level; and
   another terminal connected to a gate electrode of the second transistor.

6. The scan driver of claim 1, wherein the fifth transistor includes:
   a gate electrode connected to the first clock signal input terminal;
   one terminal connected to the sequential input terminal; and
   another terminal connected to a gate electrode of the first transistor.

7. The scan driver of claim 1, wherein each of the scan driving blocks further comprises a first capacitor having one terminal connected to a VGH power source and another terminal connected to a gate electrode of the second transistor.

8. The scan driver of claim 7, wherein each of the scan driving blocks includes a second capacitor having one terminal connected to a gate electrode of the first transistor and another terminal connected to another terminal of the first transistor.

9. A scan driver comprising a plurality of scan driving blocks each including a first sequential input terminal, a second sequential input terminal, a first clock signal input terminal, a second clock signal input terminal, a first sequential output terminal, a second sequential output terminal, and a signal output terminal;
   each of the scan driving blocks comprising:
   a first input block receiving one of a first frame start signal and a first sequential output signal of an adjacent scan driving block through the first sequential input terminal, receiving a first clock signal through the first clock signal input terminal, and receiving a second clock signal having an inverse-phase voltage level of the first clock signal through the second clock signal input terminal so as to output a first sequential output signal of said scan driving block to the first sequential output terminal;
   a second input block receiving one of a second frame start signal and a second sequential output signal of the adjacent scan driving block through the second sequential input terminal, receiving one of the first clock signal and the second clock signal through the first clock signal input terminal, and receiving another of the first clock signal and the second clock signal through the second clock signal input terminal differently from the first clock signal input terminal so as to output a second sequential output signal of said scan driving block to the second sequential output terminal; and
   an output block receiving the first sequential output signal of said scan driving block and the second sequential output signal of said scan driving block so as to output an output signal of a predetermined pulse width to the signal output terminal.

10. The scan driver of claim 9, wherein the first input block includes a first inverse-output input terminal to which the first sequential output signal of the first sequential output terminal of the adjacent scan driving block is applied.

11. The scan driver of claim 9, wherein the second input block includes a second inverse-output input terminal to which the second sequential output signal of the second sequential output terminal of the adjacent scan driving block is applied.

12. The scan driver of claim 9, wherein the output block outputs a voltage of a logic high level during the predetermined pulse width.

13. The scan driver of claim 9, wherein the output block outputs a voltage of a logic low level during the predetermined pulse width.

14. The scan driver of claim 9, wherein the output block includes:
   a first transistor including a gate electrode connected to the first sequential output terminal of the first input block so as to output a power source voltage of a logic high level;
   a second transistor including a gate electrode connected to the first sequential output terminal of the first input block so as to output a power source voltage of a logic low level;
   a third transistor including a gate electrode connected to the second sequential output terminal of the second input block so as to output the power source voltage of the logic low level;
   a fourth transistor including a gate electrode connected to the power source of the logic low level through the third transistor, and connected to the power source voltage of the logic high level through the first transistor;
   a fifth transistor including a gate electrode connected to the power source voltage of the logic low level through the second transistor, and connected to the power source voltage of the logic high level through the fourth transistor, so as to transmit the power source voltage of the logic high level to the signal output terminal; and
   a sixth transistor including a gate electrode connected to the power source voltage of the logic high level through the first transistor, and connected to the power source voltage of the logic low level through the third transistor, so as to transmit the power source voltage of the logic low level to the signal output terminal.

15. The scan driver of claim 14, wherein the gate electrode of the first transistor is connected to the first sequential output terminal of the first input block, and wherein the first transistor includes:
   one terminal connected to the power source voltage of the logic high level; and
   another terminal connected to the gate electrode of the fourth transistor and to the gate electrode of the sixth transistor.

16. The scan driver of claim 14, wherein the gate electrode of the second transistor is connected to the first sequential output terminal of the first input block, and wherein the second transistor includes:
   one terminal connected to the power source voltage of the logic low level; and another terminal connected to the gate electrode of the fifth transistor.

17. The scan driver of claim 14, wherein the gate electrode of the third transistor is connected to the second sequential output terminal of the second input block, and wherein the third transistor includes:
one terminal connected to the power source voltage of the logic low level; and
another terminal connected to the gate electrode of the fourth transistor and to the gate electrode of the sixth transistor.

18. The scan driver of claim 14, wherein the gate electrode of the fourth transistor is connected to the other terminal of the first transistor and to the other terminal of the third transistor, and wherein the fourth transistor includes:
one terminal connected to the power source voltage of the logic high level; and
another terminal connected to the gate electrode of the fifth transistor.

19. The scan driver of claim 14, wherein the gate electrode of the fifth transistor is connected to the other terminal of the second transistor and to the other terminal of the fourth transistor, and wherein the fifth transistor includes:
one terminal connected to the power source voltage of the logic high level; and
another terminal connected to the signal output terminal.

20. The scan driver of claim 14, wherein the gate electrode of the sixth transistor is connected to the other terminal of the first transistor and to the other terminal of the third transistor, and wherein the sixth transistor includes:
one terminal connected to the power source voltage of the logic low level; and
another terminal connected to the signal output terminal.

21. The scan driver of claim 14, wherein the output block further comprises a first capacitor including one terminal connected to the power source voltage of the logic high level and another terminal connected to the gate electrode of the fifth transistor.

22. The scan driver of claim 21, wherein the output block further comprises a second capacitor including one terminal connected to the gate electrode of the sixth transistor and another terminal connected to the other terminal of the sixth transistor.

23. The scan driver of claim 14, wherein the output block further comprises:
a seventh transistor including a gate electrode connected to a typical signal input terminal so as to output the output signal of the logic low level from the signal output terminal, one terminal connected to the power source voltage of the logic high level, and another terminal connected to the gate electrode of the fifth transistor; and
an eighth transistor including a gate electrode connected to the typical signal input terminal, one terminal connected to the power source voltage of the logic low level, and another terminal connected to the gate electrode of the sixth transistor.

24. The scan driver of claim 23, wherein a typical signal of a gate-on voltage for turning on the seventh transistor and the eighth transistor is simultaneously transmitted to the plurality of scan driving blocks.

25. The scan driver of claim 14, wherein the output block further comprises:
a seventh transistor including a gate electrode connected to a typical signal input terminal so as to output the output signal of the logic high level from the output terminal, one terminal connected to the power source voltage of the logic high level, and another terminal connected to the gate electrode of the sixth transistor; and
an eighth transistor including a gate electrode connected to the typical signal input terminal, one terminal connected to the power source voltage of the logic low level, and another terminal connected to the gate electrode of the fifth transistor.

26. The scan driver of claim 25, wherein a typical signal of a gate-on voltage for turning on the seventh transistor and the eighth transistor is simultaneously transmitted to the plurality of scan driving blocks.

27. The scan driver of claim 14, wherein the output block further comprises:
a seventh transistor including a gate electrode connected to a first typical signal input terminal so as to output the output signal of the logic high level from the signal output terminal, one terminal connected to the power source voltage of the logic high level, and another terminal connected to the gate electrode of the sixth transistor;
an eighth transistor including a gate electrode connected to the first typical signal input terminal, one terminal connected to the power source voltage of the logic low level, and another terminal connected to the gate electrode of the fifth transistor;
a ninth transistor including a gate electrode connected to a second typical signal input terminal so as to output the output signal of the logic low level from the signal output terminal, one terminal connected to the power source voltage of the logic high level, and another terminal connected to the gate electrode of the fifth transistor; and
a tenth transistor including a gate electrode connected to the second typical signal input terminal, one terminal connected to the power source voltage of the logic low level, and another terminal connected to the gate electrode of the sixth transistor.

28. The scan driver of claim 27, wherein a first typical signal of a gate-on voltage for turning on the seventh transistor and the eighth transistor is simultaneously transmitted to the plurality of scan driving blocks.

29. The scan driver of claim 27, wherein a second typical signal of a gate-on voltage for turning on the ninth transistor and the tenth transistor is simultaneously transmitted to the plurality of scan driving blocks.

30. A method for driving a scan driver which includes a plurality of scan driving blocks, said method comprising the steps of:
applying one of a first frame start signal and a first output signal of an adjacent scan driving block to a first sequential input terminal of a first block;
applying a first clock signal to a first clock signal input terminal of the first block, and applying a second clock signal having an inverse-phase voltage level of the first clock signal to a second clock signal input terminal of the first block, so as to output the first output signal;
applying one of a second frame start signal and a second output signal of the adjacent scan driving block to a second sequential input terminal of a second block;
applying the second clock signal to a first clock signal input terminal of the second block, and applying the first clock signal to a second clock signal input terminal of the second block, so as to output a second output signal; and
transmitting the first output signal and the second output signal to a third block for outputting a third output signal of a predetermined pulse width.

31. The method of claim 30, further comprising the step of simultaneously transmitting a typical signal so as to output an output signal of a logic low level to a plurality of third blocks included in the plurality of scan driving blocks.

32. The method of claim 30, further comprising the step of simultaneously transmitting a typical signal so as to output an output signal of a logic high level to a plurality of third blocks included in the plurality of scan driving blocks.

* * * * *